United States Patent
Watanabe

(10) Patent No.: US 7,456,480 B2
(45) Date of Patent: Nov. 25, 2008

(54) SEMICONDUCTOR DEVICE

(75) Inventor: Hiroshi Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 542 days.

(21) Appl. No.: 11/154,628

(22) Filed: Jun. 17, 2005

(65) Prior Publication Data
US 2006/0087360 A1   Apr. 27, 2006

(30) Foreign Application Priority Data
Sep. 28, 2004   (JP) .............................. 2004-282058

(51) Int. Cl.
*H01L 27/088* (2006.01)
(52) U.S. Cl. .............................. 257/393; 257/E45.002
(58) Field of Classification Search ................ 320/121; 365/201; 257/393, E45.002
See application file for complete search history.

(56) References Cited

U.S. PATENT DOCUMENTS

| | | | | |
|---|---|---|---|---|
| 6,498,957 | B1 * | 12/2002 | Umetsu ........................ | 700/22 |
| 6,768,286 | B2 * | 7/2004 | Trembley .................... | 320/117 |
| 2004/0061518 | A1 | 4/2004 | Watanabe et al. | |
| 2004/0150468 | A1 | 8/2004 | Shimizu et al. | |
| 2006/0087360 | A1 | 4/2006 | Watanabe | |

FOREIGN PATENT DOCUMENTS

| | | |
|---|---|---|
| JP | 2004-94922 | 3/2004 |
| JP | 2004-172404 | 6/2004 |
| JP | 2004-326981 | 11/2004 |

OTHER PUBLICATIONS

U.S. Appl. No. 12/015,147, filed Jan. 16, 2008, Watanabe, et al.
U.S. Appl. No. 12/049,715, filed Mar. 17, 2008, Watanabe, et al.
U.S. Appl. No. 11/469,706, filed Sep. 1, 2006, Watanabe, et al.

* cited by examiner

*Primary Examiner*—Louie Wai-Sing
*Assistant Examiner*—Bilkis Jahan
(74) *Attorney, Agent, or Firm*—Oblon, Spivak, McClelland, Maier & Neustadt, P.C.

(57) ABSTRACT

A semiconductor device includes an input terminal, a first aging device whose source is connected to the input terminal to turn on at $\tau 1$ and turn off at $\tau 2$ ($>\tau 1$), a second aging device whose source is connected to the input terminal, whose gate is connected to the drain of the first aging device, and whose drain is connected to the gate of the first aging device to turn on at $\tau 3$ and turn off at $\tau 4$ ($>\tau 3$), a first switch whose one terminal is connected to the drain of the first aging device to turn off when the second aging device is on, a second switch whose one terminal is connected to the drain of the second aging device to turn off when the first aging device is on, and an output terminal connected to the other terminals of the first and second switch elements.

11 Claims, 25 Drawing Sheets

FIG. 3
| | Forget | | Remember | |
|---|---|---|---|---|
| | p-MOSFET | n-MOSFET | p-MOSFET | n-MOSFET |
| Type | Normally Off | | Normally On | |
| Switch | On→Off | | Off→On | |
| Charge | Electron | Hole | Hole | Electron |
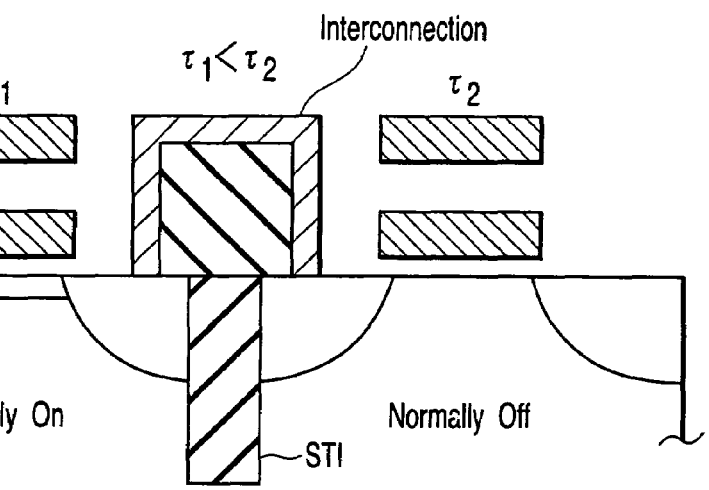
FIG. 4
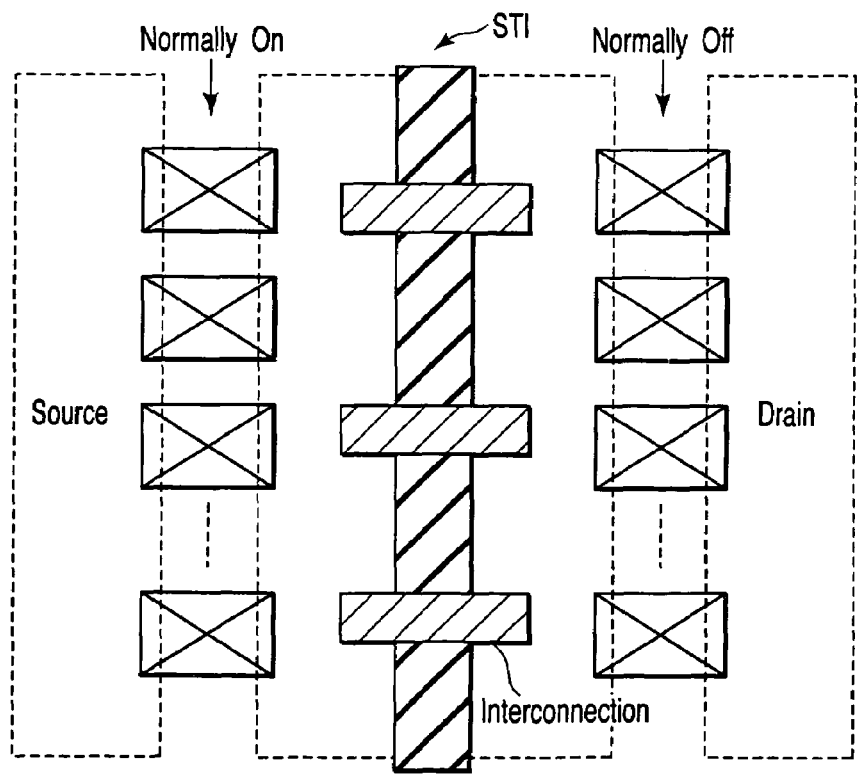
FIG. 5

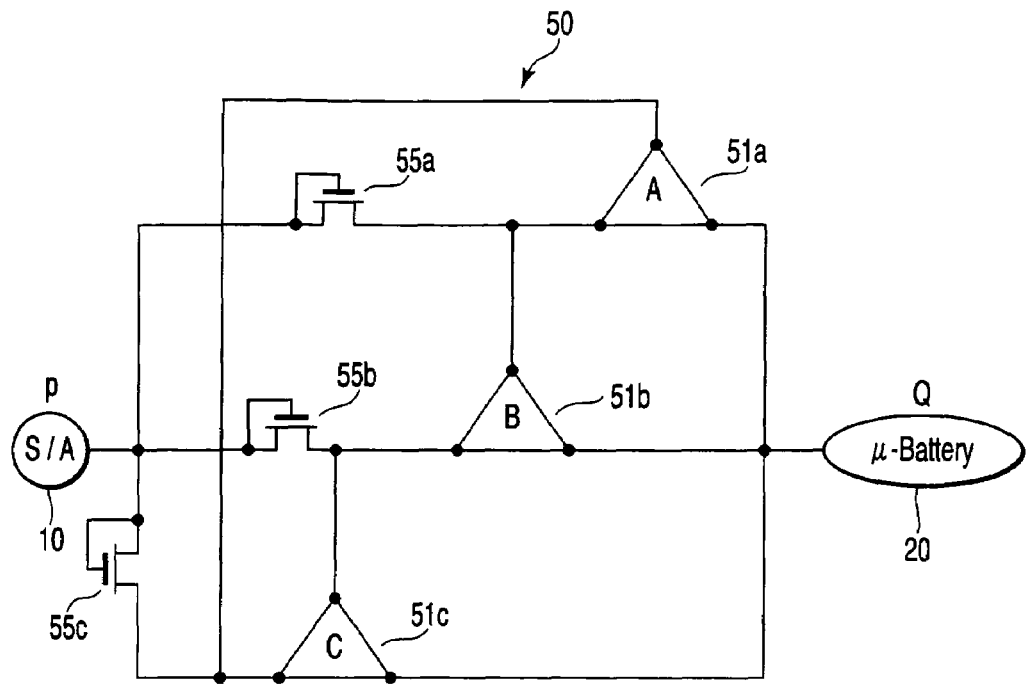
F I G. 2 0
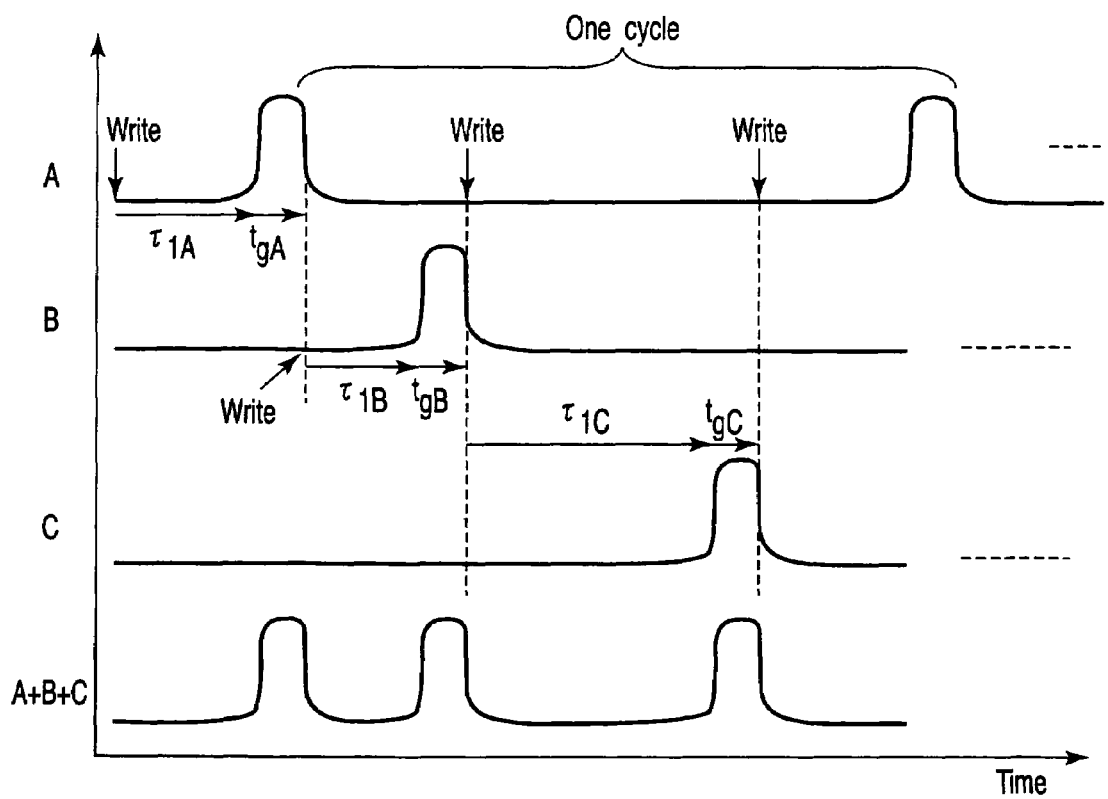
F I G. 2 1

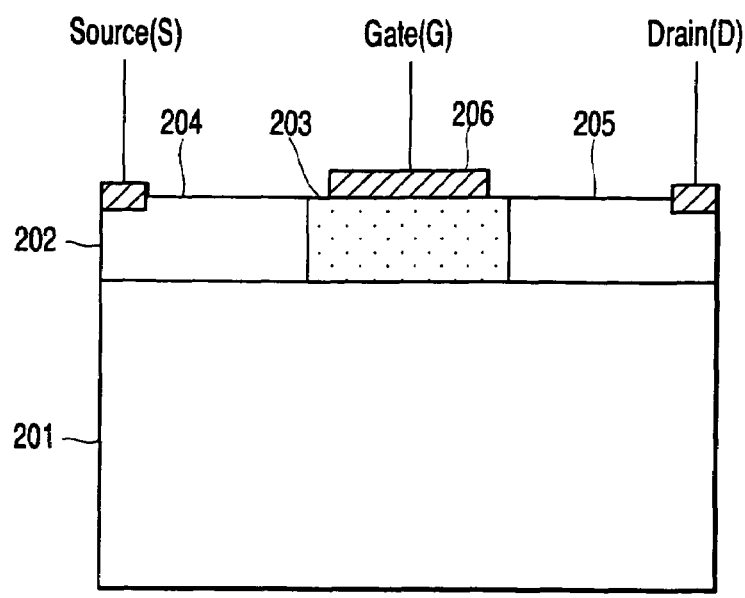
F I G. 31

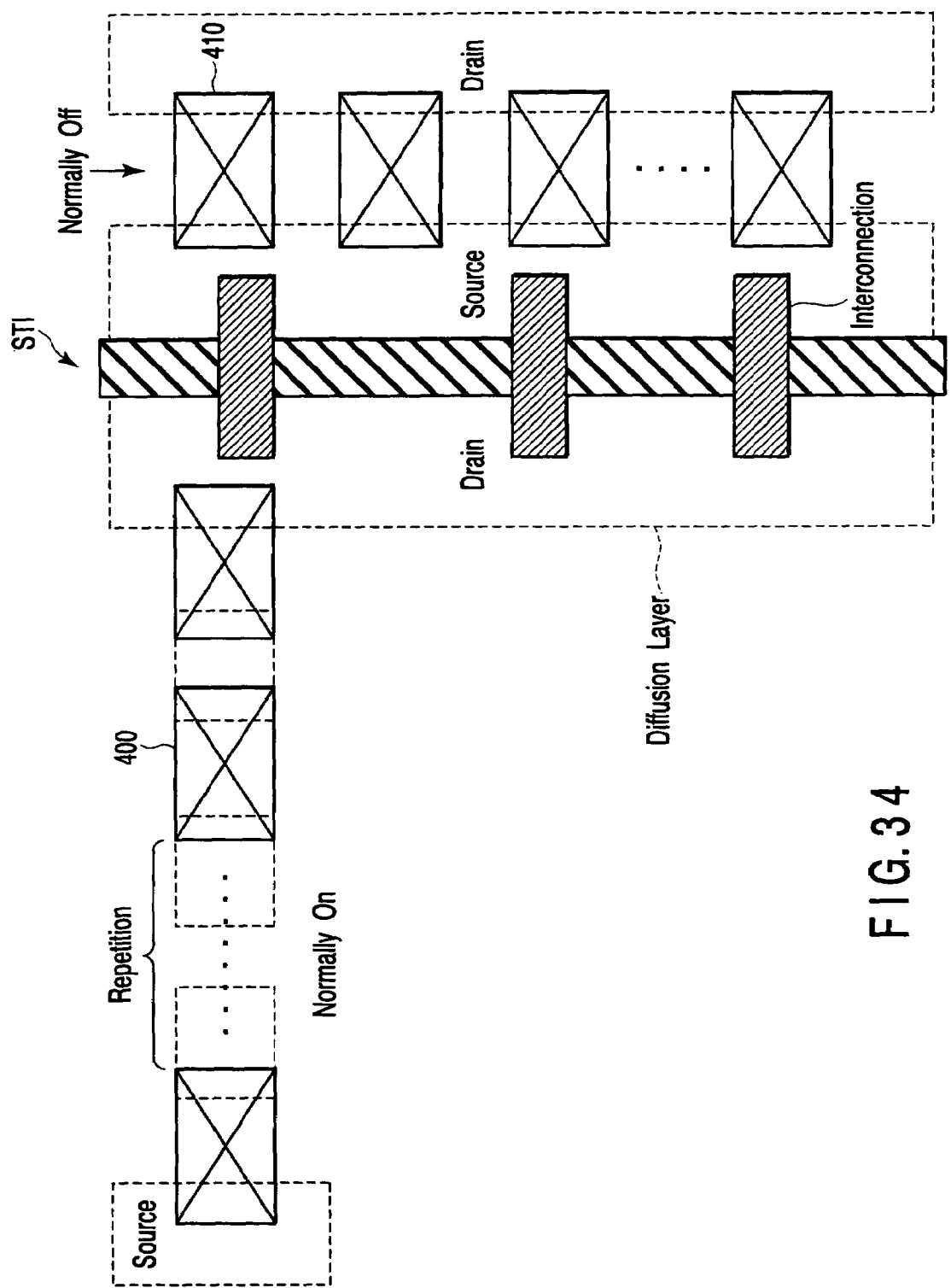
F I G. 34

SEMICONDUCTOR DEVICE

CROSS-REFERENCE TO RELATED APPLICATIONS

This application is based upon and claims the benefit of priority from prior Japanese Patent Application No. 2004-282058, filed Sep. 28, 2004, the entire contents of which are incorporated herein by reference.

BACKGROUND OF THE INVENTION

1. Field of the Invention

The present invention relates to a semiconductor device, particularly to a semiconductor device using an age-based change device (aging device) whose output changes with the elapse of time.

2. Description of the Related Art

As one of the technical problems of a radio frequency identification tag (RFID) called an active chip on which a power supply is mounted, for example, the life of a battery (μ-battery) needs to be lengthened. In addition to lengthening the life of the μ-battery itself, it is also important to save IC power. For IC power saving, miniaturization of the semiconductor device has heretofore been a trend, but in recent years, it has been recognized that the trend has almost reached its limit because of the increase in leakage current due to the miniaturization.

On the other hand, it is assumed that RFIDs are attached to all surrounding matters as utilized, but there is a problem that it is difficult to sort the RFID in disposing the matter to which the RFID is attached. In this case, a material for use in the μ-battery has to be eco-friendly. That is, it is not a situation that any material is usable to achieve long life. Thus, it is very hard to lengthen the life of the μ-battery with ordinary means.

Considered from another application of the μ-battery, it is a problem to reduce cost of the μ-battery itself in a system LSI. That is, the cost cannot be sacrificed in order to maintain the long life while avoiding a material having an environmental load. The lengthening of the life of the battery is also an important problem for an LSI mounted on a car, which continues to operate even while an engine is turned off.

As described above, there has heretofore been a demand for lengthening the life of the μ-battery as one of the technical problems in RFID or the like, but there are problems that the power saving of the IC cannot be expected by the miniaturization of the semiconductor device, a battery having a large environmental load cannot be used, and cost cannot be sacrificed. Therefore, in the present situation, long life cannot be realized yet.

Therefore, there has been a demand for the realization of the semiconductor device capable of substantially extending the life of the μ-battery or the like using the aging device.

BRIEF SUMMARY OF THE INVENTION

According to a first aspect of the invention, there is provided a semiconductor device which comprises:

an input terminal;

a first aging device comprising a first source, a first drain, and a first gate, the first source being connected to the input terminal in such a manner as to turn on at a first life $\tau 1$ and turn off at a second life $\tau 2$ ($>\tau 1$);

a second aging device comprising a second source, a second drain, and a second gate, the second source being connected to the input terminal, the second gate being connected to the first drain of the first aging device, the second drain being connected to the first gate of the first aging device in such a manner as to turn on at a third life $\tau 3$ and turn off at a fourth life $\tau 4$ ($>\tau 3$);

a first switch element comprising a first terminal and a second terminal, the first terminal being connected to the first drain of the first aging device in such a manner as to turn off when the second aging device is on;

a second switch element comprising a third terminal and a fourth terminal, the third terminal being connected to the second drain of the second aging device in such a manner as to turn off when the first aging device is on; and an output terminal connected to the second terminal of the first switch element, and the fourth terminal of the second switch element.

According to a second aspect of the invention, there is provided a semiconductor device which comprises:

a first terminal;

a second terminal; and an aging device comprising a source, a drain, and a gate, conduction being made between the source and the drain after elapse of a predetermined time after electric charges are injected into the gate, the source being connected to the first terminal, the drain being connected to the second terminal, the gate being connected to the drain.

According to a third aspect of the invention, there is provided a semiconductor device which comprises:

an input terminal;

an output terminal;

N aging devices each comprising a source, a drain, and a gate, each of the aging devices being connected in common to the input terminal in such a manner as to turn on at a first life $\tau 1$ and turn off at a second life $\tau 2$ ($>\tau 1$); and a switch element which is inserted between the output terminal and the drain of each of the aging devices, and which turns on when a corresponding one of the aging devices is on and which is off when another of the aging devices is on, the drain of an i-th aging device being connected to the gate of a i+1-th aging device, the drain of an N-th aging device being connected to the gate of a first aging device, i being a natural number from 1 to N−1.

BRIEF DESCRIPTION OF THE SEVERAL VIEWS OF THE DRAWING

FIG. 3 is a schematic diagram showing the unit cell function of the aging device;

FIG. 4 is a sectional view schematically showing one example of a cell structure of the aging device for use in the present invention;

FIG. 5 is a diagram showing an example in which a plurality of aging devices are connected;

FIG. 20 is a circuit configuration diagram showing another modification of the third embodiment;

FIG. 21 is a diagram showing a principle of a transmitted triplet pulse;

FIG. 31 is an element structure sectional view showing an aging device using a phase change memory;

FIG. 34 is an explanatory view showing a basic configuration of the aging device according to an eighth embodiment;

DETAILED DESCRIPTION OF THE INVENTION

According to embodiments described hereinafter, by use of an aging device whose state changes in a predetermined life, for example, a power supply is turned on/off at a predetermined timing. Accordingly, the life of a µ-battery or the like is prolonged, and a power supply can be automatically switched. It is also possible to output a pulse shaped into a desired waveform.

Prior to description of the embodiments of the present invention, the aging device (Jpn. Pat. Appln. KOKAI Publication No. 2004-172404, the entire contents of which are incorporated herein by reference) already proposed by the present inventors will be described.

Figure 1A:
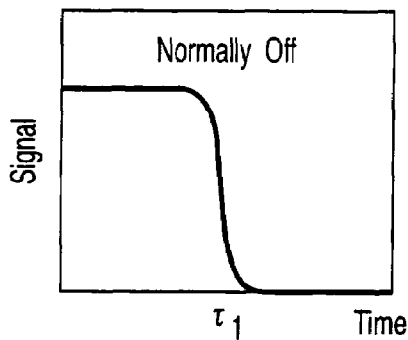
FIGS. 1A to 1D are schematic diagrams showing a function of a unit cell of an aging device.
Figure 1B:
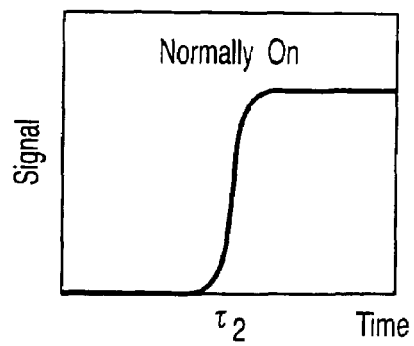
Figure 1C:
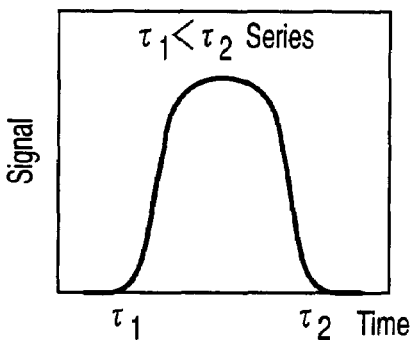
Figure 1D:
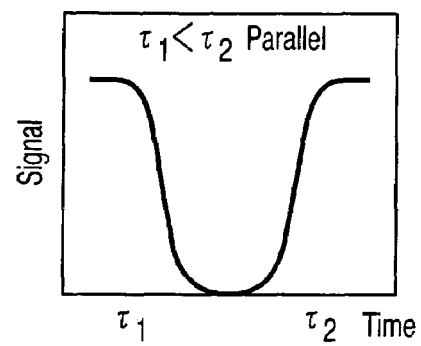

FIGS. 1A to 1D show four basic functions of the aging device. FIG. 1A shows that when the life ($\tau 1$) of the aging device is reached during elapse of time, a signal disappears. FIG. 1B shows that when the life ($\tau 2$) of the aging device is reached during elapse of time, a signal appears. FIG. 1C shows that when the first life ($\tau 1$) of the aging device is reached during elapse of time, a signal appears. During the further elapse of time, when the second life ($\tau 2$) of the aging device that is longer than the first life is reached, a signal disappears. FIG. 1D shows that when the first life ($\tau 1$) of the aging device is reached during the elapse of time, a signal disappears. During the further elapse of time, when the second life ($\tau 2$) of the aging device that is longer than the first life is reached, a signal appears.

Figure 2:
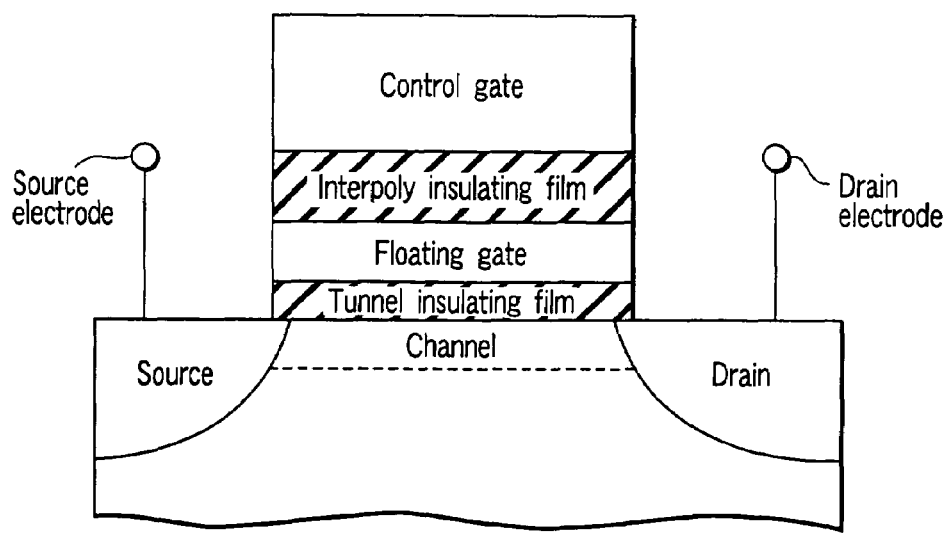
FIG. 2 is a sectional view showing a device structure of the aging device for use in the present invention.

FIG. 2 is a sectional element structure view showing an example of a unit cell of the aging device. A section and a write operation are similar to those of a usual flash memory. In the write operation, a high voltage is applied to a control gate, and electrons are injected into a floating gate from a channel by FN tunneling. In the aging device, erasing is not especially performed, a tunnel insulating film between the floating gate and the channel is formed to be thinner than the flash memory. The electrons come out of the floating gate due to direct tunneling, whereas a channel resistance changes with the elapse of time. This property is utilized. This aging of the channel resistance causes a current (drain current, ID) between a source and drain to be aged.

Additionally, a method for realizing the change with time is not one type as described above. As shown in FIG. 3, there are four types of a transistor. In a normally-on type, the aging device realizes a function of "remember". In a normally-off type the aging device realizes a function of "forget".

In the normally-off type, electrons (in case of pMOSFET) or holes (nMOSFET) are stored (written) in the floating gate to thereby reverse a channel, and an on-state is brought. With the elapse of time, the electrons or holes leak out of the floating gate, and an off-state is brought about. The life time for this change is defined as the life of the normally-off type. Conversely, in the normally-on type, electrons (in case of nMOSFET) or holes (pMOSFET) are stored (written) in the floating gate to thereby bring a channel into an off-state. With the elapse of time, the electric charges leak out of the floating gate, and the on-state is brought. The life time for this change is defined as the life of the normally-on type. The life time can be adjusted mainly by the film thickness of the tunnel insulating film.

A function of FIG. 1A is that of the above-described normally-off type aging device, and a function of FIG. 1B is that of the above-described normally-on type aging device.

FIG. 4 is an element structure sectional view showing one example of the aging device which realizes the function of FIG. 1C. A normally-on type cell is disposed on the left, and a normally-off type cell is disposed on the right. The right/left arranged aging device cells share one diffusion layer here. Alternatively, as shown in FIG. 4, electricity is conducted by an interconnection of a metal or the like, and the cells are connected in series.

As long as the normally-on type and the normally-off type are connected in series, the normally-on cells may be connected in parallel, or the normally-off cells may be connected in parallel, as shown in FIG. 5. The number of juxtaposed cells may differ with the right/left sides. This extension is sometimes required for the control of the life of the aging device.

In an example shown in FIG. 4, the life of the left normally-on type is $\tau 1$, and that of the right normally-off type is $\tau 2$. In an example shown in FIG. 5, the life of the normally-on type is $\tau 1$ with respect to a group of cells connected in parallel on the left side, and the life of the normally-off type is $\tau 2$ with respect to a group of cells connected in parallel on the right side. Here, $\tau 1$ is shorter than $\tau 2$, $\tau 1$ indicates a first life, and $\tau 2$ indicates a second life.

Moreover, when the normally-off type having the life $\tau 1$ is connected in parallel with the normally-on type having the life $\tau 2$ on a condition of $\tau 1 < \tau 2$, a function of FIG. 1D can be realized. Furthermore, in all the functions of FIGS. 1A to 1D, when a group of the cells of the same type having almost same lives is connected in parallel, controllability of the life can be improved. FIG. 5 shows one example.

In the present invention, to substantially lengthen the life of the μ-battery or the like, the above-described aging device is used. Details of the present invention will be described in accordance with shown embodiments.

FIRST EMBODIMENT

Figure 6:
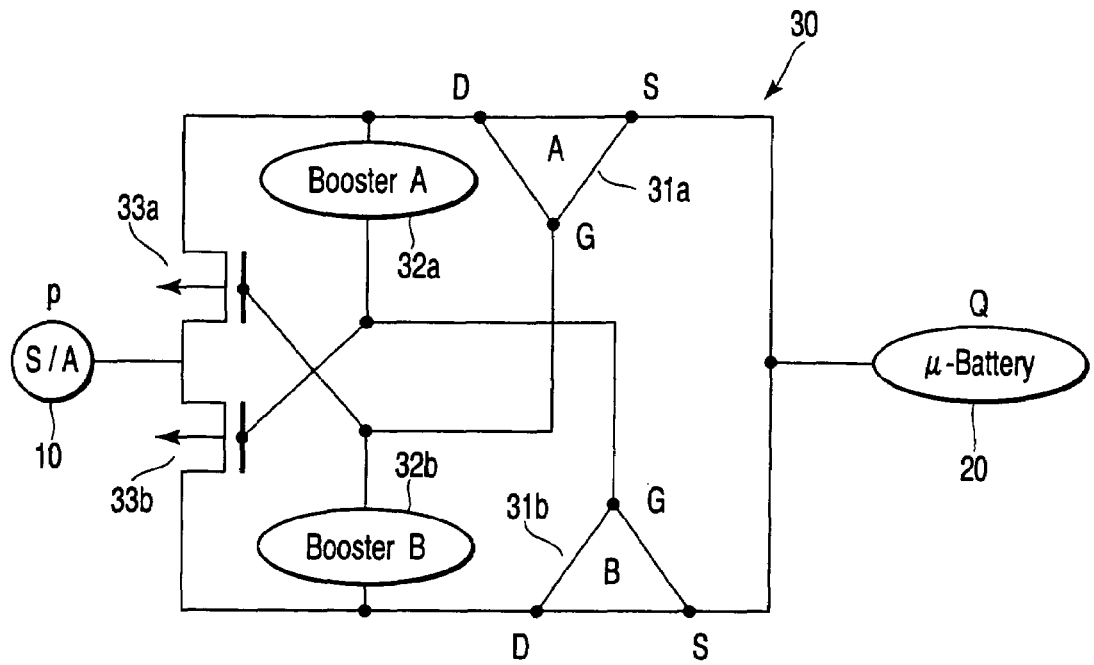
FIG. 6 is a circuit configuration diagram showing a semiconductor device (doublet pulse transmission power device) according to a first embodiment.

FIG. 6 is a circuit configuration diagram showing a semiconductor device according to a first embodiment of the present invention.

An aging device used in the present embodiment has a function of FIG. 1C. That is, when a first life ($\tau 1$) is reached with elapse of time, a signal appears. When a second life ($\tau 2$) which is longer than the first life is reached with the elapse of time, a signal disappears. In other words, a function is used in which a signal appears on-state only for a desired period from $\tau 1$ to $\tau 2$.

As shown in FIG. 6, a basic unit 30 of the present embodiment is held between a sense amplifier (S/A) 10 of a power consumption p and a μ-battery 20 having a total electric charge amount Q. This basic unit 30 is constituted of aging devices 31 (31a, 31b) having the above-described function of FIG. 1C, boosters 32 (32a, 32b) connected to the respective gates of the aging devices, and switch elements 33 (33a, 33b). It is to be noted that in the drawings of the present invention, the aging device is represented by a triangle having a source S, a drain D, and a gate G.

The source of the first aging device 31a is connected to an input end, and a drain is connected to an output end via the first switch element 33a. The source of the second aging device 31b is connected to the input end, and a drain is connected to the output end via the second switch element 33b.

Moreover, the drain of the first aging device 31a is connected to the gates of the second aging device 31b and the second switch element 33b via the first booster 32a. Accordingly, while the first aging device 31a is turned on, the second aging device 31b is charged by the booster 32a. Furthermore, the drain of the second aging device 31b is connected to the gates of the first aging device 31a and the first switch element 33a via the second booster 32b. Accordingly, while the second aging device 31b is turned on, the first aging device 31a is charged by the booster 32b.

The switch elements 33a, 33b are pMOSFET, and are of a normally-on type, which turns off when a positive voltage is applied to the gate. Therefore, the first switch element 33a turns off when the second aging device 31b turns on. The second switch element 33b turns off when the first aging device 31a is on. The input terminal is connected to the μ-battery 20, and the output terminal is connected to the S/A 10.

It is to be noted that to simplify the following description, the first aging device 31a will be referred to as the aging device A, the second aging device 31b as the aging device B, the first booster 32a as the booster A, the second booster 32b as the booster B, the first switch element 33a as the switch element A, and the second switch element 33b as the switch element B.

Figure 7A:
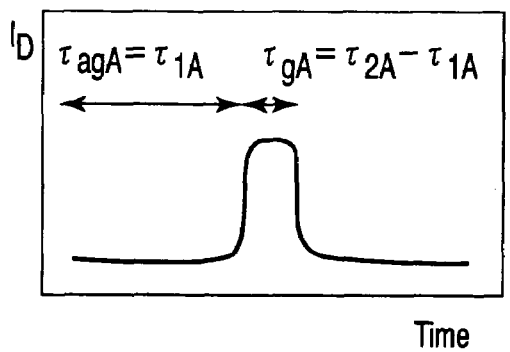
FIGS. 7A and 7B are diagrams showing characteristics of each aging device for use in the first embodiment.
Figure 7B:
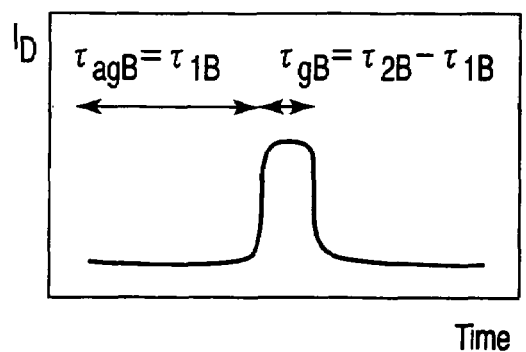

FIG. 7A shows a function of the aging device A. That is, a drain current does not flow till a first life ($\tau_{agA}$) the drain current flows from $\tau_{agA}$ till a second life ($\tau_{agA}+t_{gA}$), and no drain current flows again after the elapse of the second life. FIG. 7B shows the function of the aging device B. That is, the drain current does not flow till a first life ($\tau_{agB}$) the drain current flows from $\tau_{agB}$ till a second life ($\tau_{agB}+t_{gB}$), and drain current does not flow again after the elapse of the second life.

Additionally, assuming as time zero a state in which the aging device A is written, the change of the device with time will be described with reference to FIG. 8. With the elapse of the first life ($\tau_{agA}$) of the aging device A, the source (S) and the drain (D) of the aging device A are brought into an on-state, and the booster A turns on. A potential boosted by the booster A is applied to the gate (G) of the aging device B, and the aging device B is written from the first life ($\tau_{agA}$) till the ($\tau_{agA}+t_{gA}$). Both the aging devices A and B are in an off-state until time $\tau_{agB}$ elapses. The aging device B is in an on-state between ($\tau_{agA}+t_{gA}+\tau_{agB}$) and ($\tau_{agA}+t_{gA}+\tau_{agB}+t_{gB}$), the booster B operates, the boosted potential is applied to the gate (G) of the aging device A, and the aging device A is written. This is repeated, and A and B are alternately written to generate a pulse.

Figure 8:
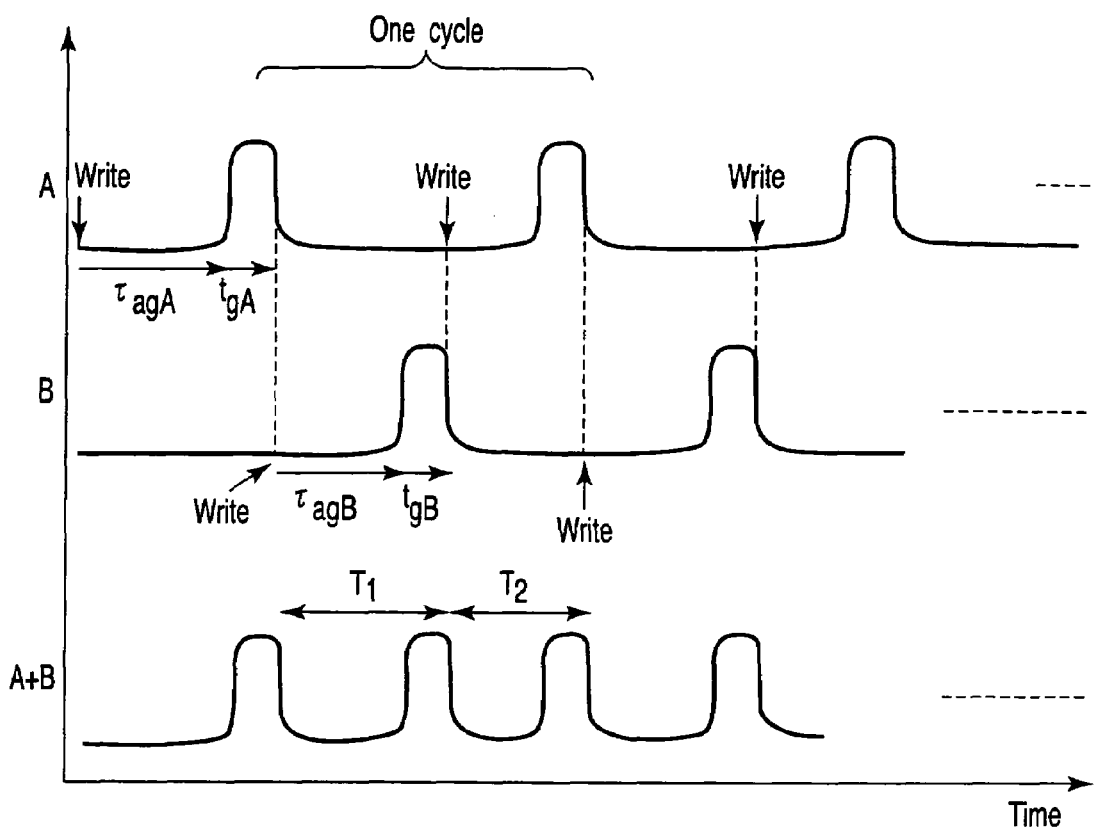
FIG. 8 is an explanatory view showing a principle of a transmitted doublet pulse.

In FIG. 8, <u>A</u> shown on the ordinate indicates a pulse concerning the aging device A, <u>B</u> is a pulse concerning the aging device B, and <u>A+B</u> is a pulse which reaches a sense amplifier by juxtaposition of A and B. Since two pulses are superimposed upon each other to form a doublet pulse, two pulse waveforms exist in one cycle. An interval T1 does not have to be equal to T2. When the intervals are equal, a single pulse is only constituted.

Figure 9:
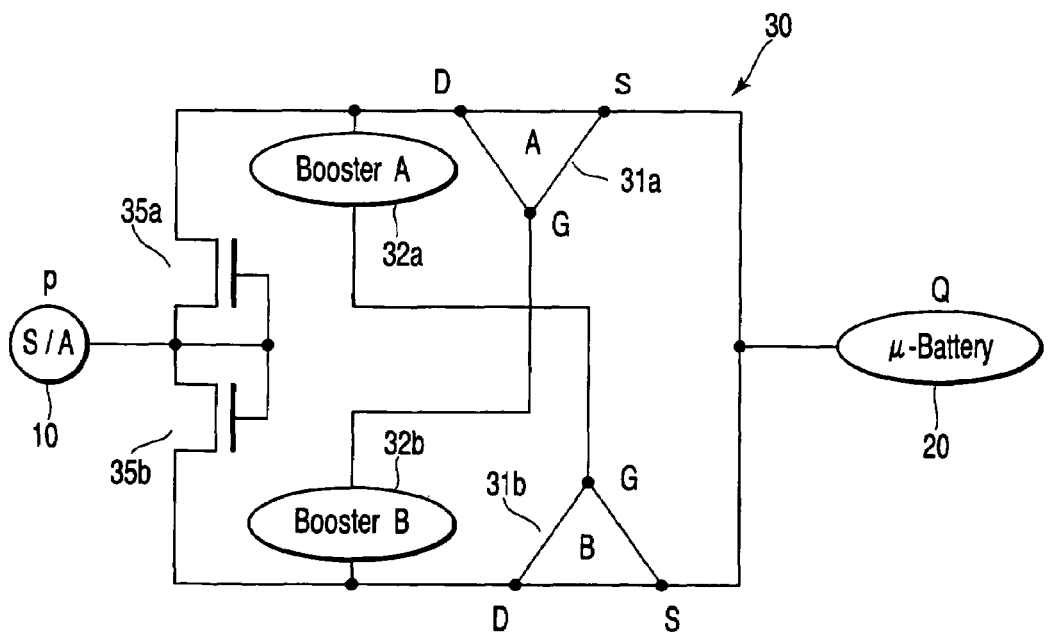
FIG. 9 is a diagram showing another example of a switch circuit for use in the first embodiment.

A switch element is not necessarily limited to an MOSFET 33 shown in FIG. 6. As shown in FIG. 9, a gate and drain of an MOSFET 35 are connected to form a diode connection. In this case, the switch element A turns on only when the aging device A is on. The switch element B turns on, only when the aging device B turns on. Substantially the same operation as that of FIG. 6 is achieved.

Figure 10:
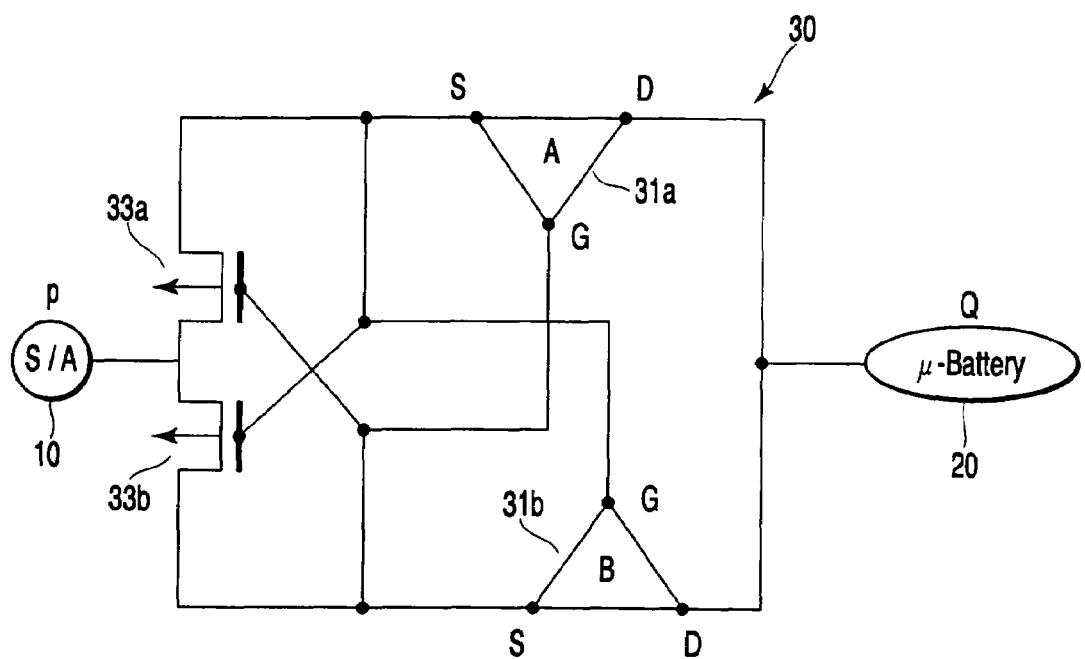
FIG. 10 is a circuit configuration diagram showing a modification of the first embodiment.

The booster 32 supplies sufficient write voltages to the aging devices A, B. When the tunnel insulating films of the aging devices A and B used in the present embodiment have sufficiently small film thicknesses, or the voltage of the μ-battery 20 is sufficiently high, the write operation can be realized without the booster 32 in the present embodiment. In this case, as shown in FIG. 10, the booster 32 can be omitted.

Figure 11:
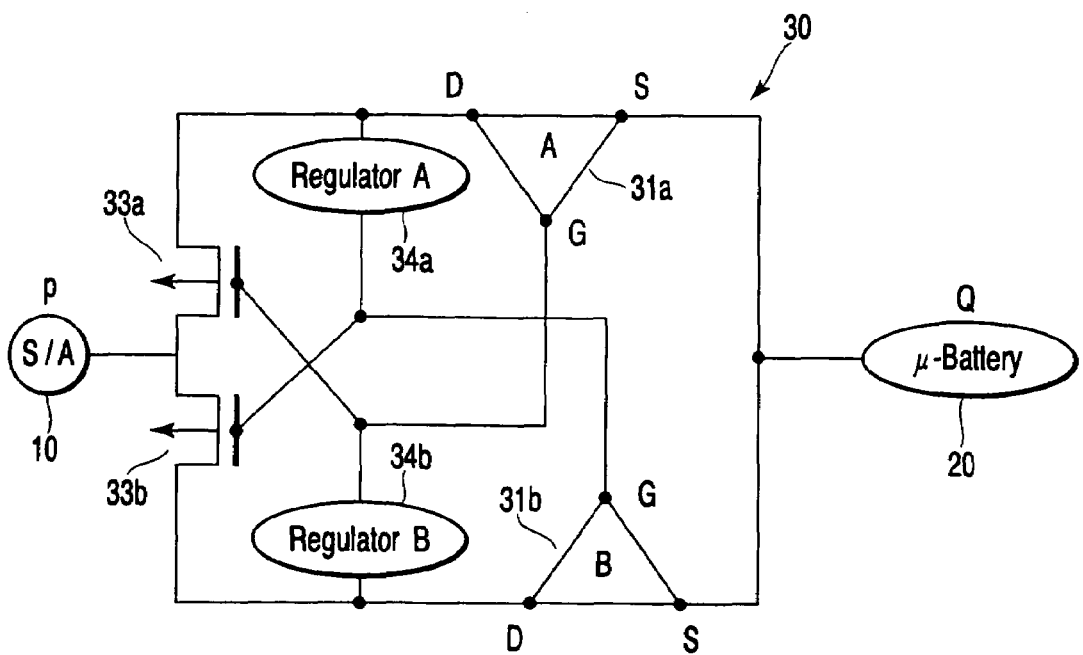
FIG. 11 is a circuit configuration diagram showing another modification of the first embodiment.

Moreover, as shown in FIG. 11, regulators 34 (34a, 34b) may be used instead of the booster 32. Here, the regulator 34 is capable of adjusting a voltage on an output side. In this case, since the voltage applied to the gate can be adjusted, the life of the aging device can be adjusted.

Figure 12:
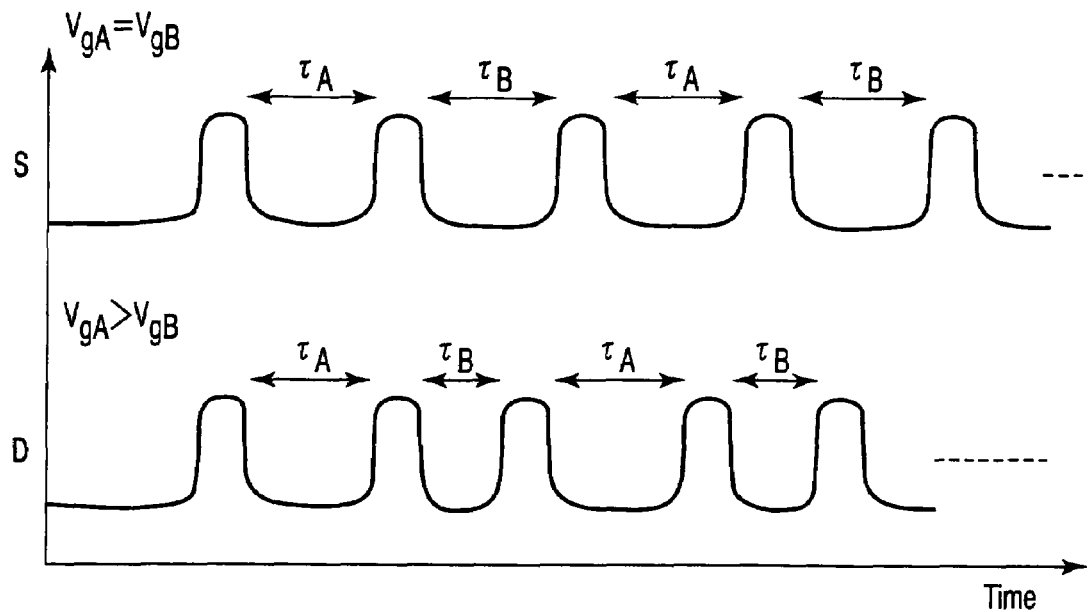
FIG. 12 is an explanatory view of a principle of a transmitted pulse according to the first embodiment.

A change of the pulse will be described with reference to FIG. 12. While the same write voltages ($V_{gA}=V_{gB}$) are applied to the aging devices A and B in an upper stage S of FIG. 12, a lower stage D shows a pulse waveform in a case where a lower write voltage ($V_{gA} > V_{gB}$) is applied to the aging device B. For simplicity, $\tau_A = \tau_B$ is set in S. That is, a single pulse waveform is assumed. In D, $\tau_B$ is shorter than S, and the waveform is changed to a double pulse waveform. When the regulator 34 is used in this manner, it is possible to adjust the pulse waveform.

In the use of the regulator 34 or the booster 32, there is another merit that the influence of stability in the battery performance on the pulse is suppressed.

Here it is important that the S/A 10 operates only when the aging device A or B is in the on-state. That is, the power from the battery 20 is not generally constant. When the pulse of electricity is supplied as in the present embodiment, the battery life can be substantially easily extended, even if the life of the battery itself is not lengthened, or power consumption of IC is not substantially suppressed.

Next, in consideration of the power consumed in writing with respect to the aging device, a degree of extension of the life will be described. First, a power will be considered which is consumed in one cycle ($\tau_{agA}+t_{gA}+\tau_{agB}+t_{gB}$).

$$p \cdot (\tau_{agA}+t_{gA}+\tau_{agB}+t_{gB}) > I_{gA}V_{gA}t_{gB}+I_{gB}V_{gB}t_{gA}+pt_{gA}+pt_{gB} \quad (1)$$

Equation (1) indicates on a left side a power consumed in which a case where a circuit of the present embodiment is not disposed, that is, a case where a basic unit is omitted from the present embodiment, the basic unit comprising the aging device 31, booster 32, or regulator 34 to directly connect the μ-battery 20 to the sense amplifier 10 in FIGS. 6, 9, 10 and 11. On the other hand, the right side indicates a power consumed in a case where the basic unit of the present embodiment is introduced. That is, the power consumed for a period ($t_{gA}$ or $t_{gB}$) while the aging device A or B is in the on-state is a sum of ($I_{gA}V_{gA}t_{gB}$) consumed in the writing of the aging device A, ($I_{gB}V_{gB}t_{gA}$) consumed in the writing of the aging device B, and ($pt_{gA}+pt_{gB}$) consumed in the S/A 10 in this period. Note that $I_{gA}$, $I_{gB}$ are gate currents at writing time of the aging device A and aging device B.

Here, a case is studied where the tunnel insulating film of the aging device 31 is sufficiently thin, and the power consumed in the booster 32 or regulator 34 is ignored. To be more specific, the power consumed in the booster 32 or regulator 34 has to be also taken into consideration, but there is not any essential change in matters described below. A term corresponding to this power consumption may be added to the equation (1) in a range in which the essence of the present invention is not impaired.

When the equation (1) is arranged, the following equation (2) is obtained. It is to be noted that Q denotes a total electric charge amount of the μ-battery.

$$\frac{Q}{P} < \frac{Q}{I_{gA}V_{gA}I_{gB}+I_{gB}V_{gB}I_{gA}} \times (\tau_{agA}+\tau_{agB}) \quad (2)$$

The left side of the equation (2) indicates the life of the μ-battery 20 in a case where the present embodiment is not used, and the right side indicates the life of the μ-battery 20 by the use of the present embodiment. Thus, the extension of the battery life is in proportion to the first life ($\tau_{agA}+\tau_{agB}$) of the aging device 31.

On the other hand, the power consumption of the booster 32, the regulator 34, or an added circuit concerning another function unit is added to the denominator of the right side of the equation (2), and there is an effect that the battery life is reduced. That is, the equation (2) means that the life of the aging device has to be controlled in consideration of the influence of reducing the life. A result is shown in the following equation (3).

$$\tau_{agA}+\tau_{agB} > \frac{\text{Power consumption regarding circuit added by the invention}}{p} \quad (3)$$

The power consumed by the writing or by the booster 32 or by the regulator 34 is included in a right-side numerator. This may be divided by a power consumption p of the sense amplifier 20, and the resultant quotient be set to be shorter than the first life of the aging device 31, that is, the normally-on type life.

Moreover, an uncontrollable error ($\pm\delta\tau$) is sometimes mixed in the first life ($\tau_{agA}+\tau_{agB}$) of the aging device 31. This is taken into consideration in the following equation (4) which is a condition equation. One example of a devise to reduce this $\delta\tau$ is the juxtaposition shown in FIG. 5 described above.

$$\tau_{agA}+\tau_{agB} \pm \delta\tau > \frac{\text{Power consumption regarding circuit added by the invention}}{p} \quad (4)$$

As described above, according to the present embodiment, the circuit is constituted of the aging device 31, booster 32, switch element 33, and regulator 34 between the sense amplifier 10 and the μ-battery 20 as shown in FIGS. 6, 9, 10, 11. Consequently, the pulse electricity can be supplied instead of constantly supplying the power, and the life of the μ-battery 20 can be extended. Therefore, when the present embodiment is applied to RFID or the like, a valid effect is exerted.

SECOND EMBODIMENT

Figure 13:
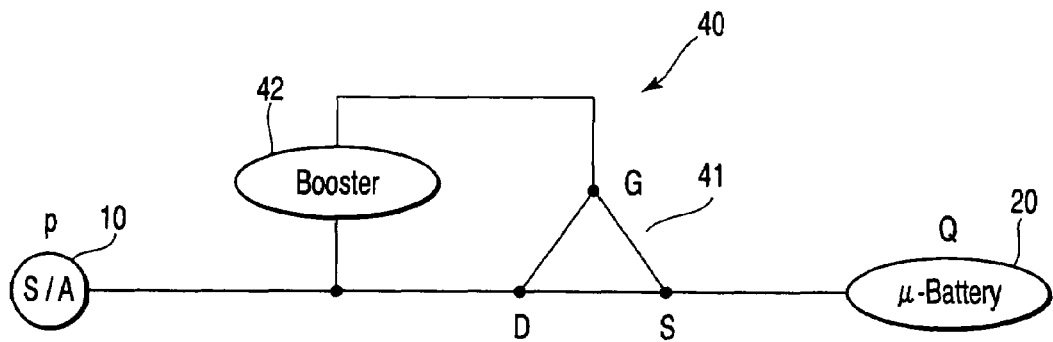
FIG. 13 is a circuit configuration diagram showing a semiconductor device (single pulse transmission power supply device) according to a second embodiment.
Figure 14:
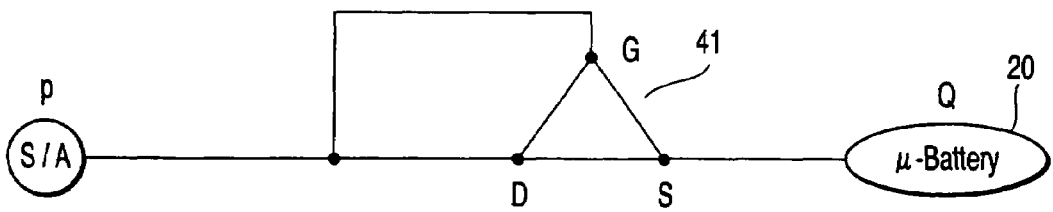
FIG. 14 is a circuit configuration diagram showing a modification of the second embodiment.
Figure 15:
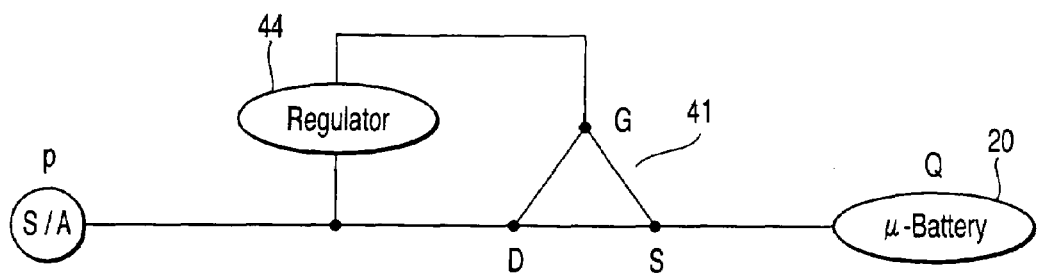
FIG. 15 is a circuit configuration diagram showing another modification of the second embodiment.

A second embodiment of the present invention will be described with reference to FIGS. 13 to 15. A difference among these three figures is the presence or absence of a booster 42 or a regulator 44. Since the above figures are basically similar, the present embodiment will be described with respect to FIG. 13 which is one of the figures. It is to be noted that the description with reference to FIGS. 14 and 15 is substantially similar to the following described, and the presence or absence of the booster and regulator may only be changed.

A basic unit 40 of the present embodiment exists between a S/A 10 and a μ-battery 20. Constituting elements of the basic unit 40 are an aging device 41 shown by a triangle, and the booster 42. The booster 42 is connected between a gate (G) and a drain (D) of the aging device 41, and an interconnection on a drain (D) side is connected to the S/A 10. Conversely, a source (S) is connected to the μ-battery 20.

A characteristic of the present embodiment is a function of the aging device 41. That is, here the characteristic lies in the use of the function of FIG. 1B described above. First, a time when the aging device 41 is written is assumed as time zero. With elapse of time by the life (normally-on type life) of the aging device 41, a potential boosted by the booster 42 is applied to the gate (G), and the write starts. A drain current continues to flow during the write, but gradually decreases. The drain current disappears, when the write is completed. This state is shown in FIG. 16.

Figure 16:
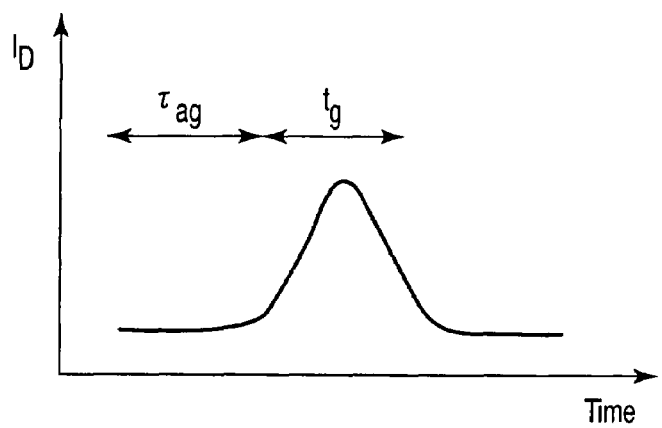
FIG. 16 is a diagram showing a principle of a transmitted singlet pulse.
Figure 17:
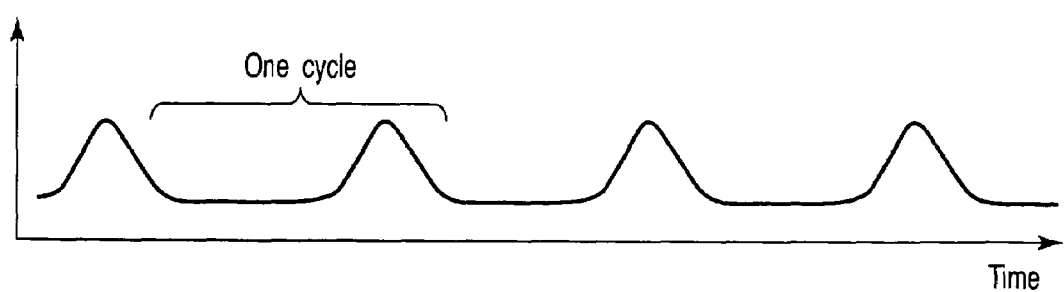
FIG. 17 is a diagram showing the transmitted single pulse.

Even when a single cell is used in this manner, the original function of the aging device shown in FIG. 1B is changed as shown in FIG. 16 in the present embodiment. After the write ends, time further elapses by a life ($\tau_{ag}$) of the aging device 41, and the same as described above is repeated. Thus, a (single) pulse waveform is output as shown in FIG. 17. The following equation (5) shows a condition for substantially extending the life of the μ-battery 20. A deriving method is similar to that of the first embodiment, and is omitted.

$$\tau_{ag} \pm \delta\tau > \frac{\text{Power consumption regarding circuit added by the invention}}{p} \quad (5)$$

THIRD EMBODIMENT

Figure 18:
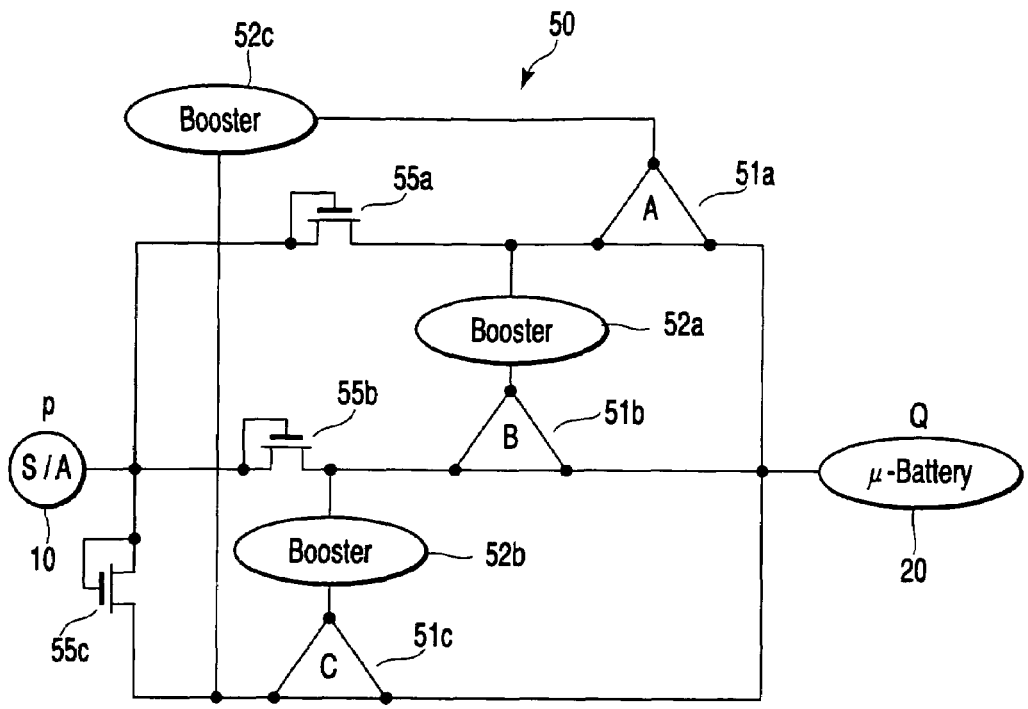
FIG. 18 is a circuit configuration diagram showing a semiconductor device (triple pulse transmission power supply device) according to a third embodiment.
Figure 19:
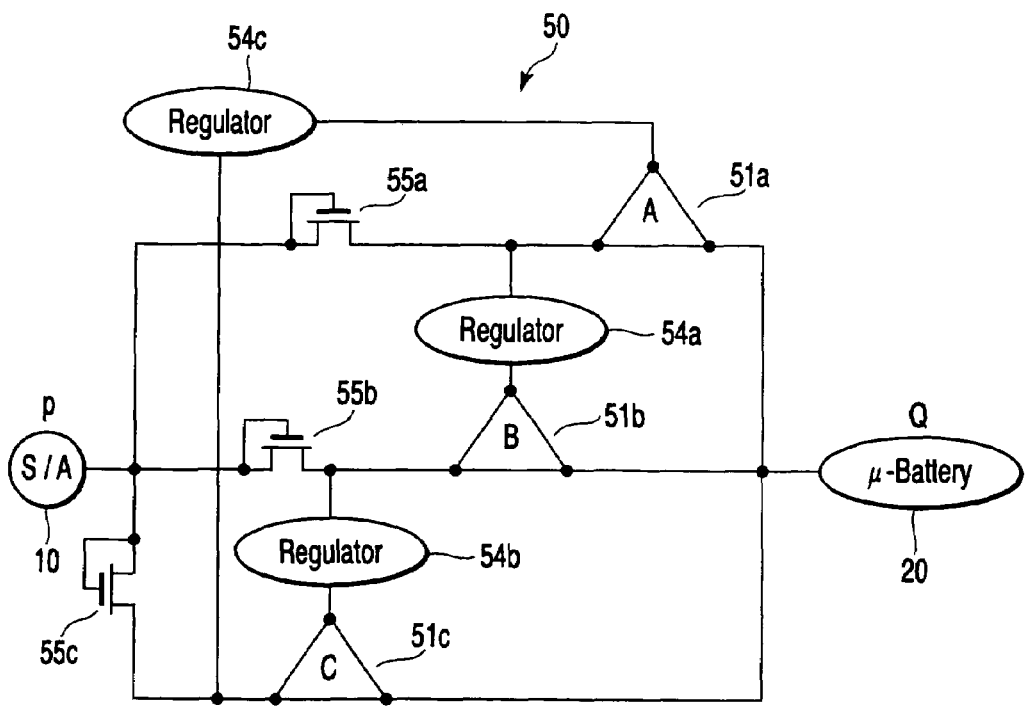
FIG. 19 is a circuit configuration diagram showing a modification of the third embodiment.

A third embodiment of the present invention will be described with reference to FIGS. 18 to 20. The present embodiment comprises three aging devices. A difference of FIGS. 18 to 20 is the presence or absence of a regulator 54 or a booster 52. The present embodiment will be described only with reference to FIG. 18 in the same manner as in the second embodiment.

As shown in FIG. 18, a basic unit 50 of the present embodiment is held between an S/A 10 having a power consumption p and a μ-battery 20 having a total electric charge amount Q. The basic unit 50 is constituted of: aging devices 51 (51a, 51b, 51c) each having the function of FIG. 1C; boosters 52 (52a, 52b, 52c) connected to gates; and switch elements 55 (55a, 55b, 55c).

A source of the first aging device 51a is connected to an input end, and a drain is connected to an output end via the first switch element 55a. The source of the second aging device 51b is connected to the input end, and a drain is connected to the output end via the second switch element 55b. The source of the third aging device 51c is connected to the input end, and the drain is connected to the output end via the third switch element 55c.

Moreover, the drain of the first aging device 51a is connected to the gate of the second aging device 51b via the first booster 52a. Accordingly, when the first aging device 51a is turned on, the second aging device 51b is charged with electric charges by the booster 52a. Furthermore, the drain of the second aging device 51b is connected to the gate of the third aging device 51c via the second booster 52b. Accordingly, when the second aging device 51b is on, the third aging device 51c is charged with the electric charges by the booster 52b.

Furthermore, the drain of the third aging device 51c is connected to the gate of the first aging device 51a via the third booster 52c. Accordingly, when the third aging device 51c is on, the first aging device 51a is charged with the electric charges by the booster 52c.

The switch elements 55 connect the gate and drain of an MOSFET to constitute a diode connection. In this case, only the switch element 55a turns on, when the aging device 51a is on. Only the switch element 55b turns on, when the aging device 51b is on. Only the switch element 55c turns on, when the aging device 51c is on.

As described above, the aging device 51 for use in the present embodiment has the function of FIG. 1C as described above. That is, after the write at time zero, a drain current does not flow till a first life ($\tau 1$), the drain current flows from the first life till a second life ($\tau 2$), and any drain current does not flow after the second life.

Next, the pulse wave form of this embodiment will be described, referring to FIG. 21, with the written timing of the aging device A setting as time zero. Note that neither the aging device B nor C is written at the time zero. More specifically, they are in the state after the second life is elapsed.

The aging devices A, B, C are shown by A, B, C on the ordinate of FIG. 21. As shown in FIG. 21, when a first life $\tau_{1A}$ of the aging device B elapses from time zero, the write of the aging device B starts. When a second life ($\tau_{1A}+t_{gA}$) of the aging device A elapses, the write of the aging device B ends. Here, when the first life ($\tau_{1B}$) of the aging device B is reached, the write of the aging device C starts. When a second life ($\tau_{1B}+t_{gB}$) of the aging device B is reached, the write of the aging device C ends. Here, when a first life ($\tau_{1C}$) of the aging device C is reached, the aging device A is again written by a second life ($\tau_{1C}+t_{gC}$) of the aging device C. When the aging devices A, B, and C are written in order in this manner, a triplet pulse is generated as shown in a lowermost stage (A+B+C) of FIG. 21. Here, $\tau_{1A}, \tau_{1B}, \tau_{1C}$ are not required to be necessarily equal. FIG. 21 shows an example of $\tau_{1B} < \tau_{1A} < \tau_{1C}$.

FOURTH EMBODIMENT

Figure 22:
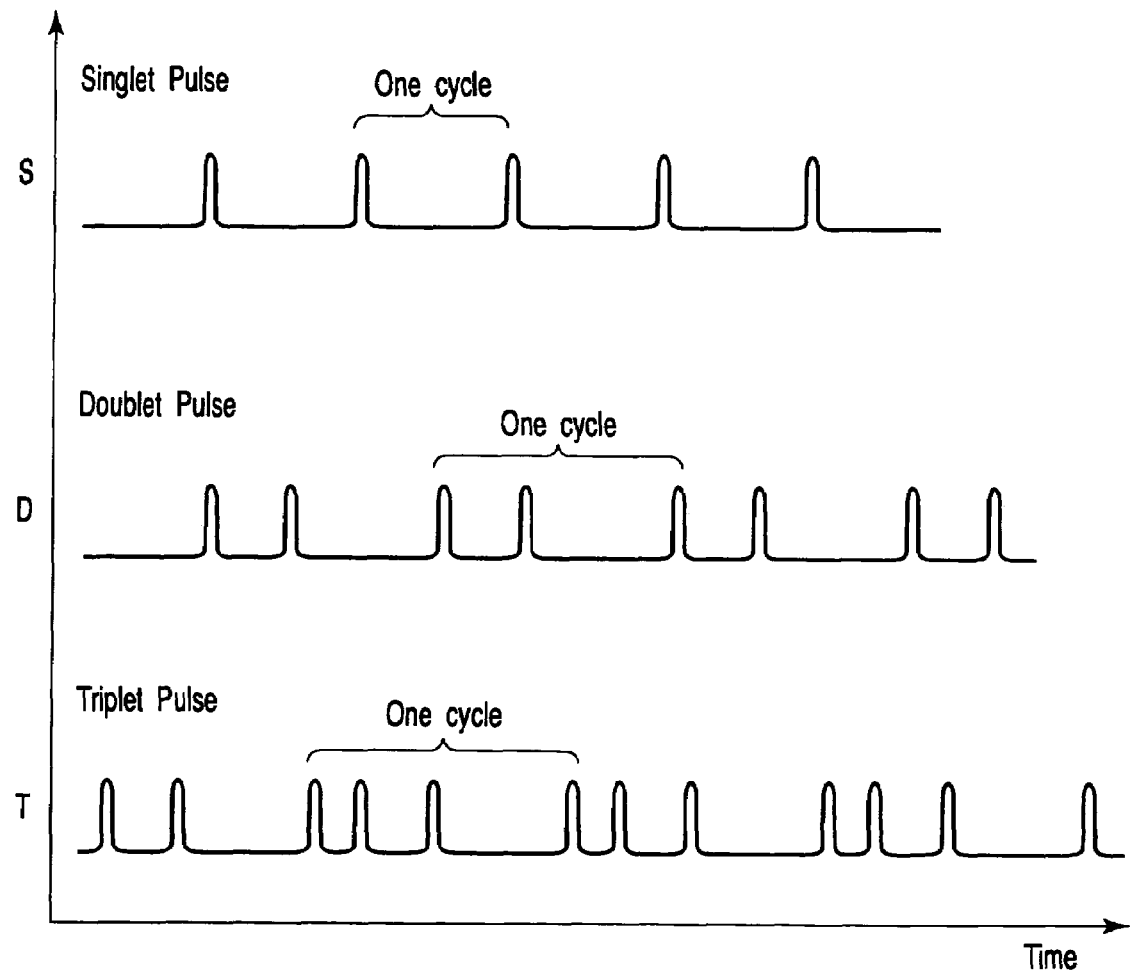
FIG. 22 is a diagram showing transmitted singlet, doublet, and triplet pulses according to a fourth embodiment.

As described above, pulse waveforms of the first to third embodiments are integrated as shown in FIG. 22. On the ordinate of FIG. 22, S shows a singlet pulse waveform, D shows a doublet pulse waveform, and T shows a triplet pulse waveform. As can be easily presumed from the above-described contents, the singlet pulse can be realized not only in a case where one aging device is used but also in a case where two cycles of a doublet pulse are equal even by the use of two aging devices. Moreover, the doublet pulse can be realized not only in a case where two aging devices are used but also in a case where two of three cycles are equal by the use of three aging devices. When an N-ply pulse is constituted, at least N aging devices have to be used.

A device for converting a battery output into a pulse output in this manner will be hereinafter referred to as a pulse block. At this time, the first to third embodiments can be integrally shown as in FIG. 23A. That is, a pulse block 60 is inserted between a sense amplifier 10 and a μ-battery 20.

Figure 23A:
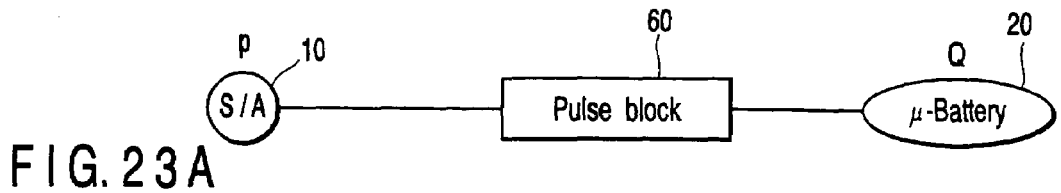
FIGS. 23A to 23E are diagrams showing a concept of a circuit configuration including a pulse block.
Figure 23B:
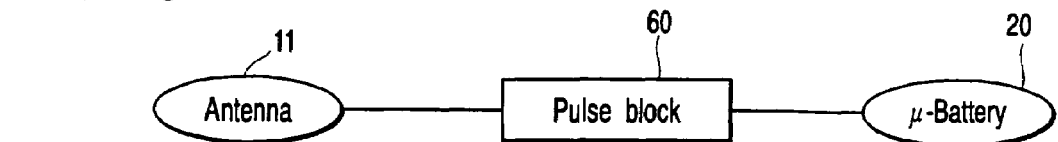
Figure 23C:
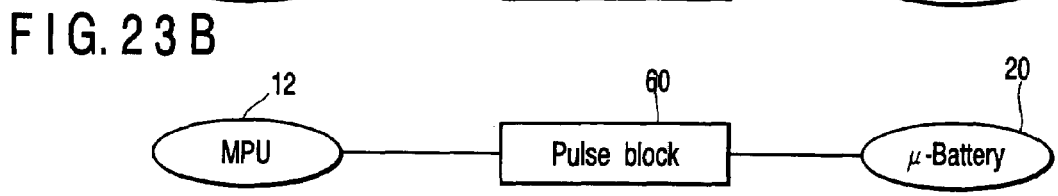
Figure 23D:
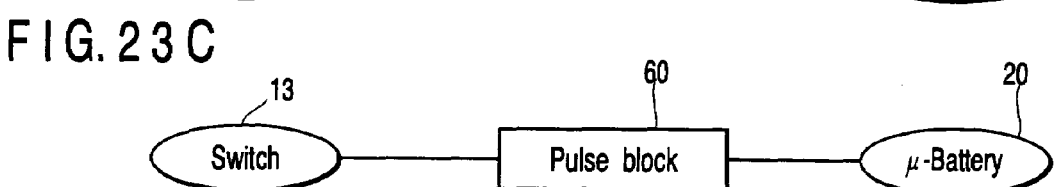
Figure 23E:
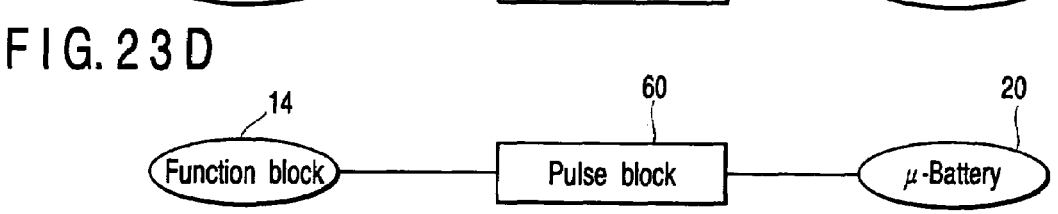

Furthermore, when the sense amplifier 10 of FIG. 23A is changed to an antenna 11, FIG. 23B results. When the antenna 11 of FIG. 23B is changed to an MPU 12, FIG. 23C results. When the MPU 12 of FIG. 23C is changed to a switch 13, FIG. 23D results. Thus, the μ-battery 20 may be connected, via the pulse block 60, to not only the sense amplifier but also a more general function block 14 as shown in FIG. 23E. Here, contents of the function block 14 may not be described in the present specification, and are not limited as long as the essence of the present invention is utilized.

Figure 24A:
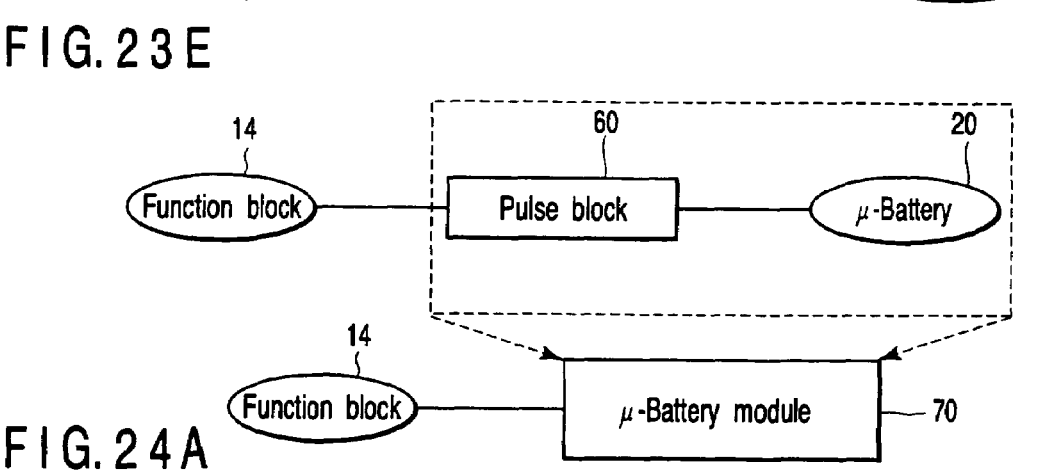
FIGS. 24A and 24B are diagrams showing a concept of a circuit configuration including a micro battery module and a set of a power source and a switch, respectively.
Figure 24B:
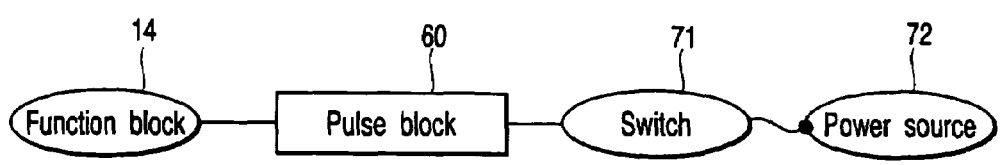

On the other hand, when the pulse block 60 is combined with the μ-battery 20, as shown in FIG. 24A, a μ-battery module 70 can be assumed. Furthermore, in FIG. 24A, the μ-battery 20 on the right side may be replaced with a combination of a certain power supply 72 and a switch 71 as shown in FIG. 24B. At this time, even when the switch 71 is turned on, the pulse block 60 has an off-state. In this case, any power is not supplied to the function block 14.

Figure 25A:
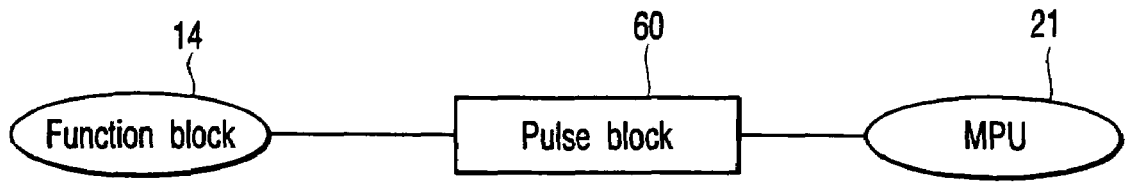
FIGS. 25A to 25D are diagrams showing a concept of a circuit configuration including the pulse block.
Figure 25B:
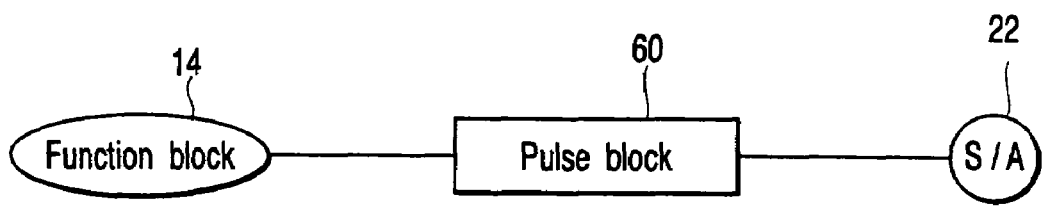
Figure 25C:
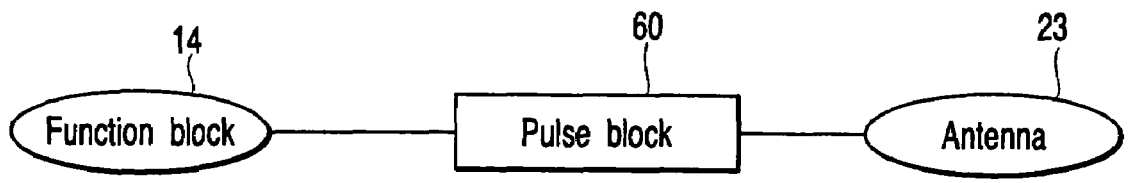
Figure 25D:
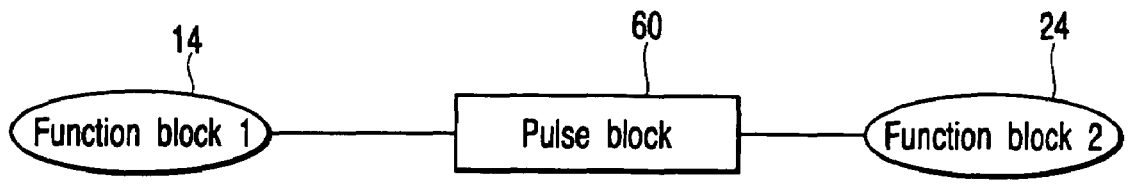

Moreover, as shown in FIG. 25A, the μ-battery 20 of FIG. 23E can be replaced with an MPU 21. The MPU 21 of FIG. 25A may be replaced with an S/A 22 as in FIG. 25B. As shown in FIG. 25C, the S/A 22 of FIG. 25B may be replaced with an antenna 23. As shown in FIG. 25D, the right side of the pulse block may be generalized, and replaced with a function block 24. Eventually, as shown in FIG. 25D, to describe more generally, the pulse block 60 is held between the function blocks 14 and 24. At this time, a power exchanged between the function blocks 14 and 24 is pulsed by the pulse block 60.

FIFTH EMBODIMENT

It is very useful to take in data at rising or falling (edge) of an input in a digital circuit, and an edge trigger type circuit to draw a trigger has been broadly used using the edge of an input pulse. A latch circuit is one type, and a state of the circuit is transited at the falling. A plurality of latch circuits are utilized together with another combined circuit, and data is exchanged between the circuits. Here, when an interval between the edges is small, the circuit easily causes an erroneous operation called racing. When the edge interval is controlled by the pulse block of the present embodiment, the racing can be suppressed.

A fifth embodiment of the present invention will be described with reference to FIGS. 26A to 26C. In the present embodiment, the pulse block 60 is applied to the latch circuit. In the figures, the pulse blocks are denoted by 61, 62, 63. Reference numeral 66 denotes an MPU, 67 denotes a latch circuit, and 68 denotes a switch.

Figure 26A:
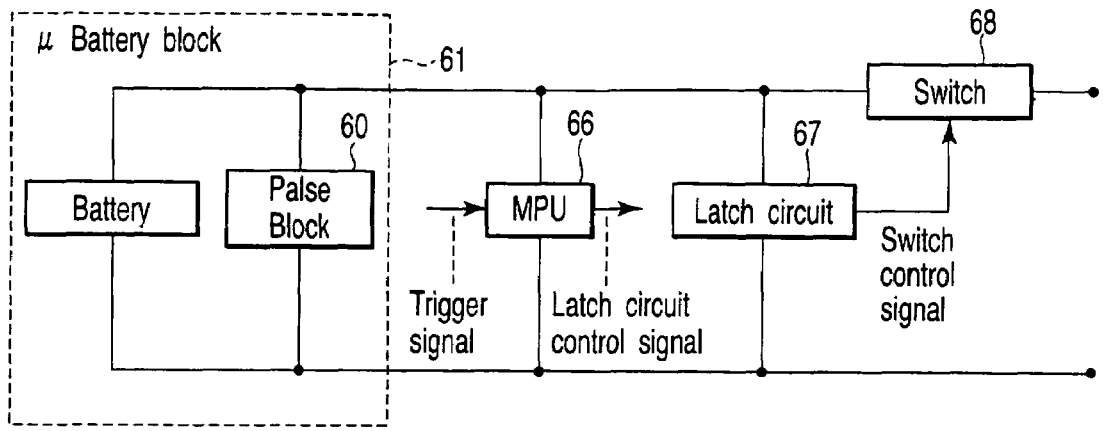
FIGS. 26A to 26C are circuit configuration diagrams showing a semiconductor device (circuit including a pulse block and a latch circuit) according to a fifth embodiment.
Figure 26B:
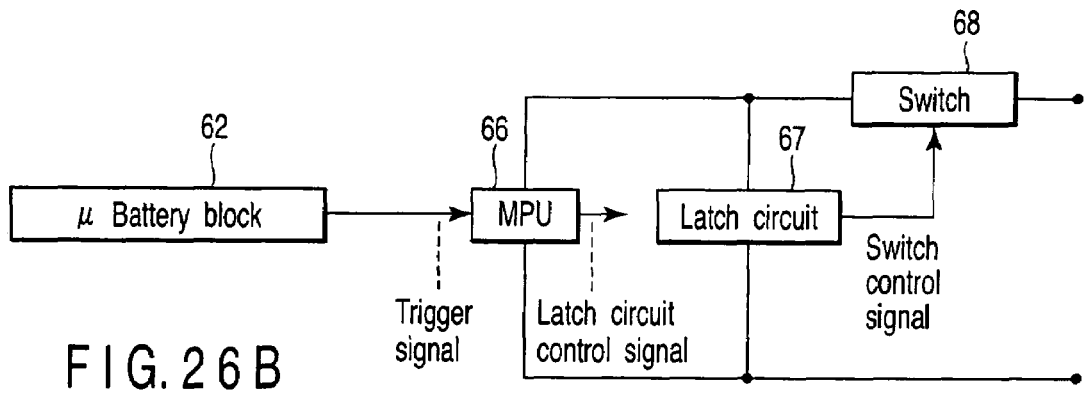
Figure 26C:
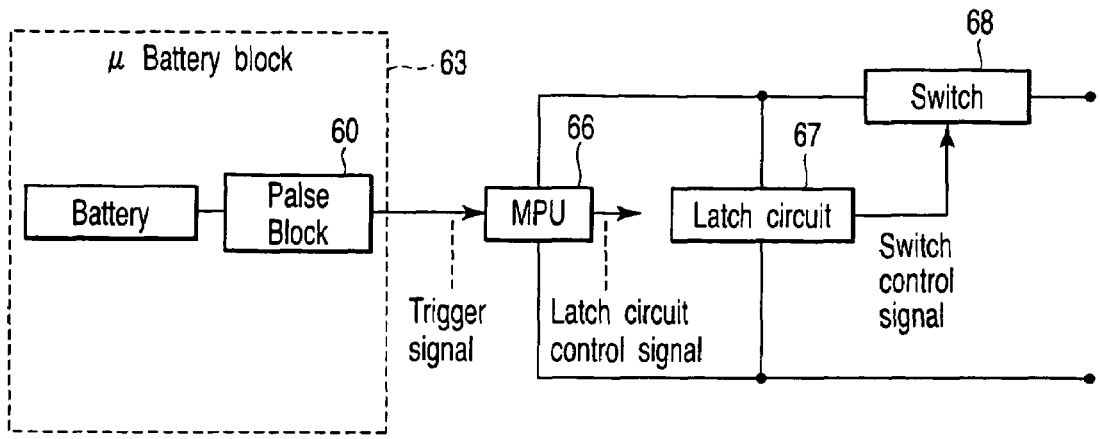

In FIG. 26A, a pulse output from the pulse block 60 is a trigger signal which moves the MPU 66, the MPU 66 transmits a latch circuit control signal, and the latch circuit 67 operates. Here, characteristics lie in that in a waveform generated by the pulse block according to the present invention, an interval (edge interval) between rising and falling can be controlled by the life $\tau_{agA}$ and $\tau_{agB}$ of the aging device as shown in FIG. 8. A similar function can be realized even with a circuit configuration shown in FIG. 26B. Furthermore, as shown in FIG. 26C, a battery and a pulse block may be replaced with a μ-battery module or a micro battery block.

SIXTH EMBODIMENT

Figure 27:
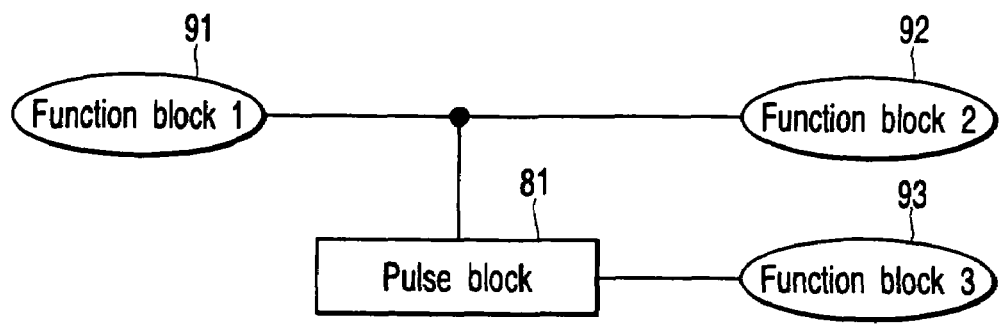
FIG. 27 is a block diagram showing a semiconductor device according to a sixth embodiment.

A sixth embodiment of the present invention will be described with reference to FIG. 27. The present embodiment comprises three function blocks and one pulse block. First, function blocks 91 and 92 are connected, and a pulse block 81 is connected to the connection so as to clamp. Moreover, a function block 93 is connected to the pulse block 81. That is, the function blocks 91, 92 are connected to an output side of the pulse block 81, and the function block 93 is connected to an input side of the pulse block 81.

In this configuration, when a pulse is in an off-state, conduction is made between the function blocks 91 and 92. When the pulse turns on, conduction is made between the function blocks 91 and 93 if the function block 92 has a higher inner resistance. Thus, by the use of the pulse block 81, a connected end can be converted. Here, when the function block 92 or 93 is provided with a power supply, the conversion of the connected end is not other than that of the power supply. Needless to say, when either function region is grounded, the conversion of the connected end is exactly the turning on and off of the power supply. By the use of this method, as described above, the device can be used as a battery life extending measure.

Figure 28:
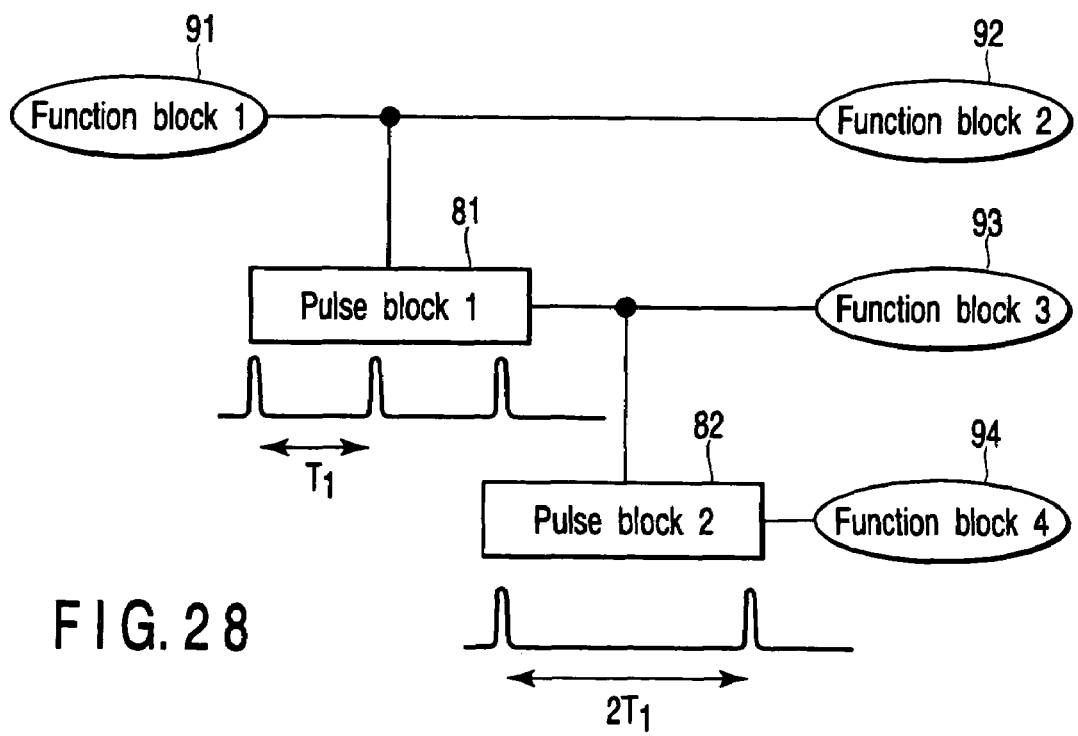
FIG. 28 is a block diagram showing a modification of the sixth embodiment.

This example is expanded to four function blocks and two pulse blocks in FIG. 28. An operation can be easily presumed from the description with reference to FIG. 27, but is slightly complicated. Therefore, the operation will be simply described. First, conduction is made between the function blocks 91 and 92. When the pulse block 81 turns on, the function block 92 is replaced with the function block 93 that has a smaller inner resistance compared with the function block 92. At this time, when the pulse block 82 also turns on, the function block 93 is further replaced with the function block 94 that has a smaller inner resistance compared with the function block 93.

If the inner resistance of the function blocks 93 and 94 are comparable, then the signal from the function block 94 is added to the signal from the function block 93.

Here, the example of FIG. 28 will be further specifically described. First, it is assumed that the pulse block 82 has a double period 2T1 with respect to a period T1 of the pulse block 81. For example, it is assumed that the pulse block 81 has an on-state for one second every ten seconds, and the pulse block 82 has an on-state for one second every twenty seconds. Furthermore, a phase can be matched in such a manner that both the pulse blocks 81 and 82 turn on for a second every 20 seconds. At this time, usually the conduction is made between the function blocks 91 and 92, but the conduction is made between the function blocks 91 and 93 for one second every 20 seconds. Further at another timing, the conduction is made between the function blocks 91 and 94 for one second every 20 seconds.

Figure 29:
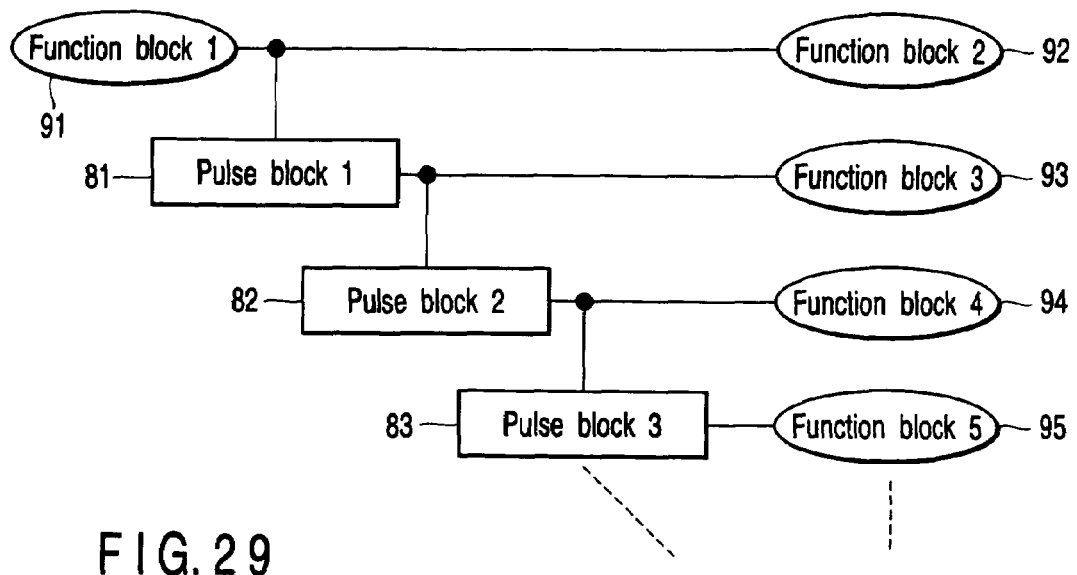
FIG. 29 is a block diagram showing another modification of the sixth embodiment.

FIG. 29 shows that the number of pulse blocks is expanded to N, and the number of function blocks is expanded to N+2. That is, when N indicates three, a pulse block 83 and a function block 95 are added to the configuration of FIG. 28. More generally, the first and second function blocks 91, 92 are connected to an output end of the first pulse block 81, and the third function block 93 including a power supply is connected to the input end of the first pulse block 81. With respect to natural number i from 2 to N, the output end of an i-th pulse block 8i is connected to the input end of an i−1-th pulse block 8(i−1). The input end of the i-th pulse block 8i is connected to an i+2-th function block 9(i+2) including the power supply.

Here, the function block does not have to necessarily include the power supply. Then, it is considered that the function block 92 is earthed, and the power supply is included in the function block 93. At this time, when the pulse block 81 has an off-state, any power is not supplied to the function block 91, and power is supplied from the function block 93 only in the on-state. By the use of this method, as described above, the device can be used as a battery life extending measure.

(Modification)

It is to be noted that the present invention is not limited to the above-described embodiments. In the embodiments, a memory cell having a double-layer gate configuration has been used as the aging device, but the present invention is not necessarily limited to this device. Any element may be used as long as the element turns on or off after elapse of a certain time after programmed.

Figure 30A:
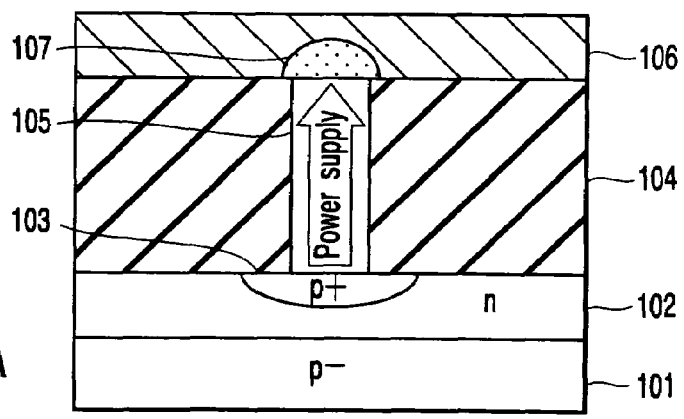
FIGS. 30A and 30B are diagrams showing a basic element structure of a conventional phase change memory.
Figure 30B:
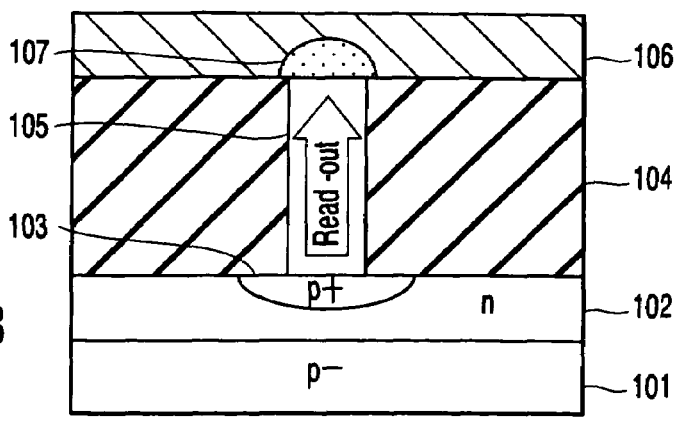

For example, as a phase change memory shown in FIGS. 30A, 30B, an ovonic unified metal (OUM) is usable (http://www.ovonic.com/PDFs/Elec_Memory_Research_Report/OUM.pdf). In FIGS. 30A, 30B, 101 denotes a p⁻-type layer, 102 denotes an n-type layer, 103 denotes a p⁺-type diffusion layer, 104 denotes an interlayer insulating film, 105 denotes an electrode, 106 denotes a polycrystalline chalcogenide layer, and 107 denotes a phase change region (program region) of the chalcogenide layer 106. In this case, a phase change (polycrystal/amorphous) of chalcogenide is utilized. The phase change is caused in the program region by power supply, and a change of a resistance value is read. For example, when an amorphous state is written to have a high resistance by current application, this state is protected for a certain time. In the phase change memory, the time is assumed as the life.

Moreover, an SSAD may be realized by the OUM as shown in FIG. 31. In FIG. 31, 201 denotes a substrate, 202 denotes a polycrystalline chalcogenide layer, 203 denotes a program region, 204 denotes a source region, 205 denotes a drain region, and 206 denotes a gate electrode. In this case, the amorphous state has its life, and is needed to be almost insulative.

Figure 32:
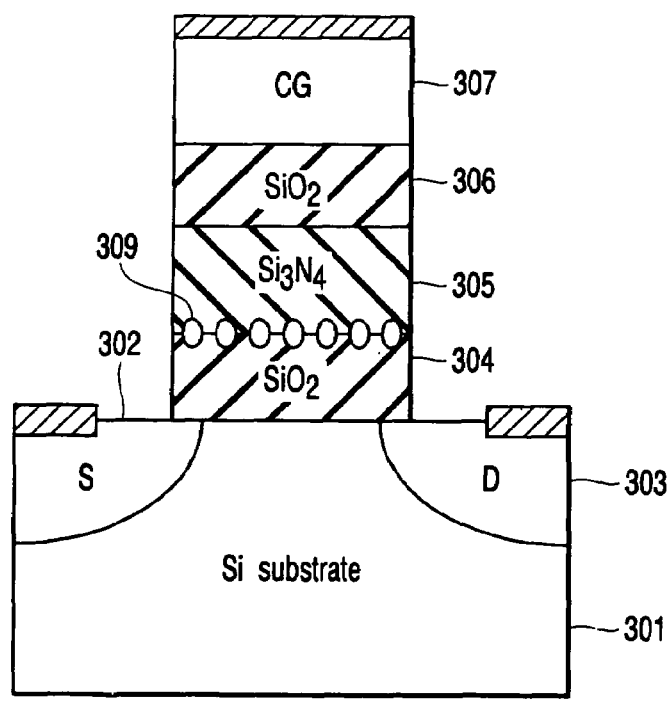
FIG. 32 is a sectional view showing a basic element structure of a conventional MONOS or SONOS.

Furthermore, as shown in FIG. 32, an SSAD may be realized by an MONOS/SONOS transistor. In FIG. 32, 301 denotes an Si substrate, 302 denotes a source region, 303 denotes a drain region, 304 denotes an $SiO_2$ film, 305 denotes an $Si_3N_4$ film, 306 denotes an $SiO_2$ film, 307 denotes a control gate, and 309 denotes an electron trap. In this case, the electron trap 309 at the interface between $Si_3N_4$ and $SiO_2$ is used to control the number of traps or trapped electrons and an emission rate of electrons, which results in the control of the life.

The embodiment has been described using the function shown in FIGS. 1B and 1C. In the next embodiment, an embodiment will be described using the function of FIG. 1D.

SEVENTH EMBODIMENT

Figure 33:
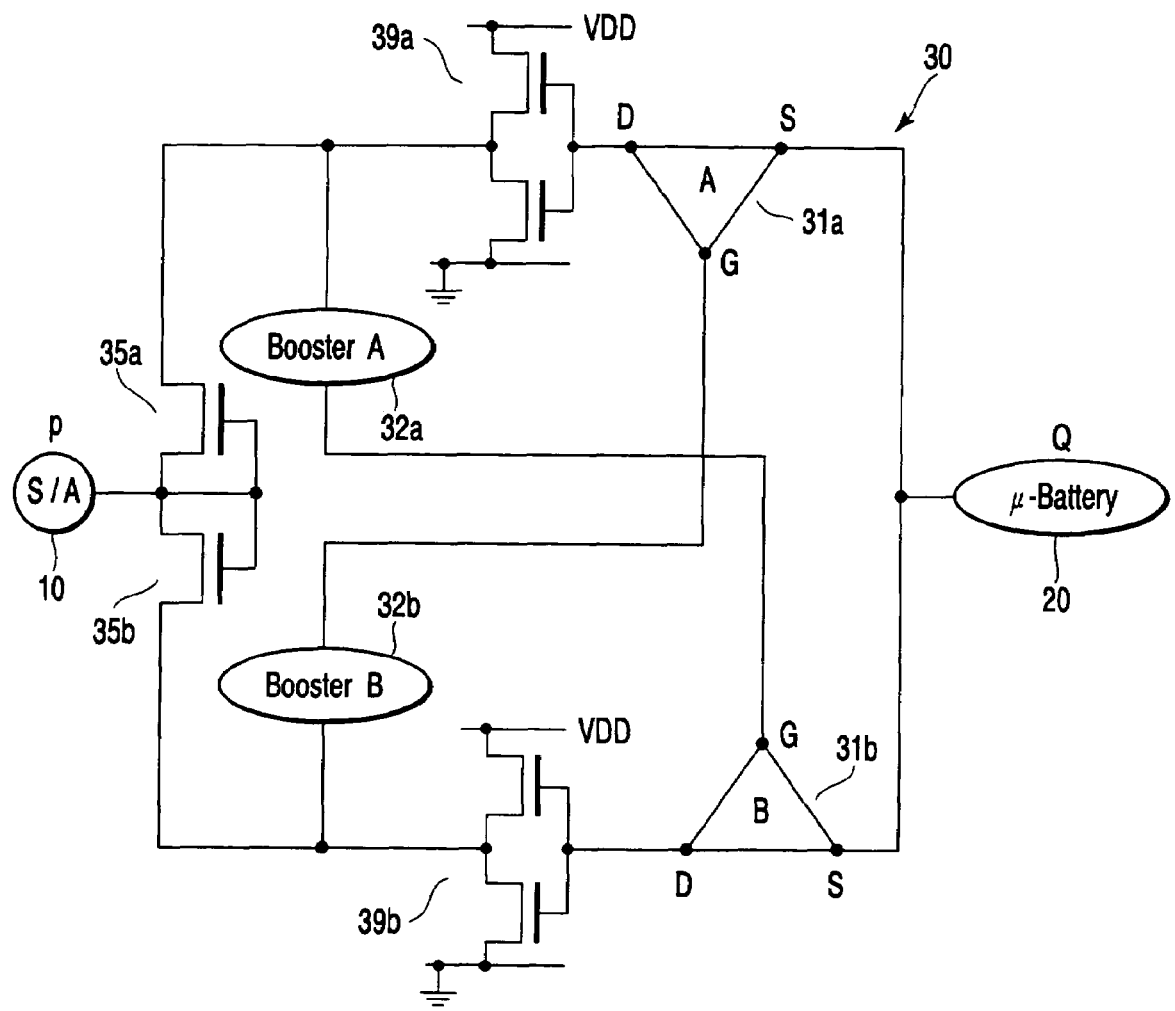
FIG. 33 is a diagram showing a circuit configuration of a semiconductor device according to a seventh embodiment.

FIG. 33 is a circuit configuration diagram showing a semiconductor device according to a seventh embodiment of the present invention. It is assumed that an aging device used in the present embodiment has a function of FIG. 1D described above. The present embodiment is different from the first embodiment shown in FIG. 9 in that an inverter circuit is connected to a drain of each aging device. Therefore, on/off of the aging device is reversed, and the subsequent operation is similar to that of the first embodiment. A booster may not be disposed as described with reference to FIG. 10, or may be replaced with a regulator as described with reference to FIG. 11. Here, a switching device has diode connection in which a gate and a drain are connected as shown in FIG. 9, but the device may be constituted as shown in FIGS. 6, 10, 11. By the use of the inverter circuit, all combinations described in the first embodiment can be realized.

EIGHTH EMBODIMENT

An aging device cell used in the above-described embodiment has a problem of a defective bit having an excessively short life in the same manner as in a usual flash memory cell. In the eighth embodiment, a configuration will be described which avoids this problem in an aging device.

First, a normally-off type will be described. Assuming that there are r (r<<N) defective bits in N aging device cells, the cells are divided into a cell group in which r cells have an excessively short life, and a cell group in which lives of the cells are distributed with the Gaussian distribution around the average of the lives of (N-r) normal cells. When all of these cells are connected in parallel, a normal cell group of (N-r) cells constitutes a current path to transmit a signal in an on-state before the life, and therefore the life of the whole juxtaposed cell group is determined by the normal cell group of (N-r) cells, That is, by the juxtaposition, it is possible to remove an influence of the defective bit group of r cells on the life of the whole juxtaposed cell group.

Next, a normally-on type will be described. Assuming that there are r (r<<N) defective bits in N aging device cells, the cells are divided into a cell group in which r cells have an excessively short life, and a cell group in which lives of the cells are distributed with the Gaussian distribution around the averaged life of (N-r) normal cells. When all of these cells are connected in series, a normal cell group of (N-r) cells cuts a current to interrupt a signal in an off-state before the life, and therefore the life of the whole series cell group is determined by the normal cell group of (N-r) cells, That is, by the series connection, it is possible to remove an influence of the defective bit group of r cells on the life of the whole series cell group.

Figure 35:
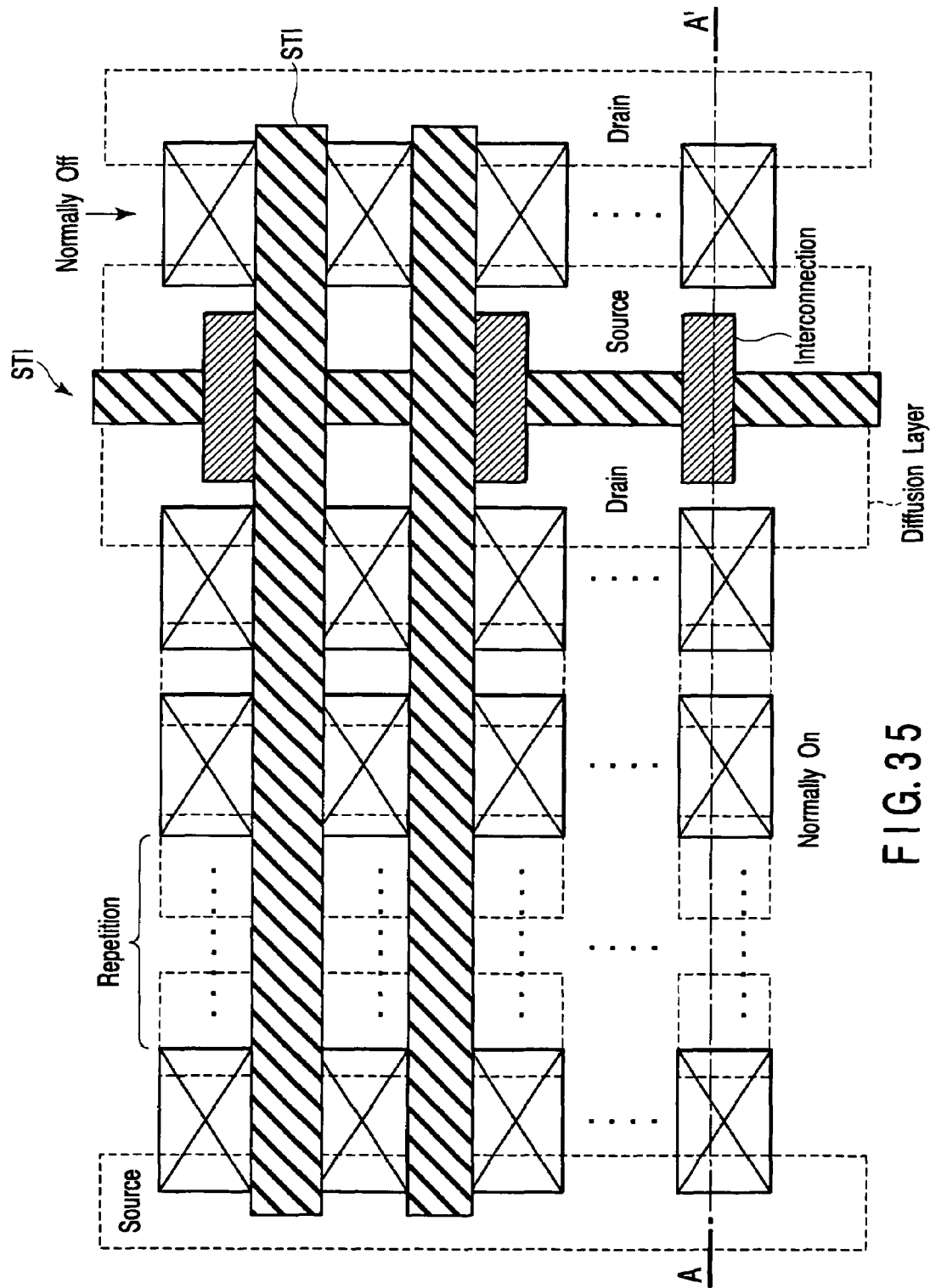
FIG. 35 is a diagram showing a configuration of the aging device according to the eighth embodiment.

Thus, the normally-on type aging devices are used in series, the normally-off type aging devices are used in parallel, and this is a simplest defective bit countermeasure. FIG. 34 shows one example of layout of an aging device system which realizes off-on-off characteristics shown in FIG. 1C by connecting serial normally-on type aging device cells 400 in series with parallel normally-off type aging device cells 410. FIG. 35 similarly shows another aging device system having a layout of the aging device system which realizes the off-on-off characteristics. FIG. 35 is different from FIG. 34 in that a plurality of series connections of the normally-on type aging device cells 400 are further connected in parallel. An advantageous reason why a plurality of series connections are further connected in parallel will be described hereinafter in order with reference to a circuit diagram.

Figure 36:
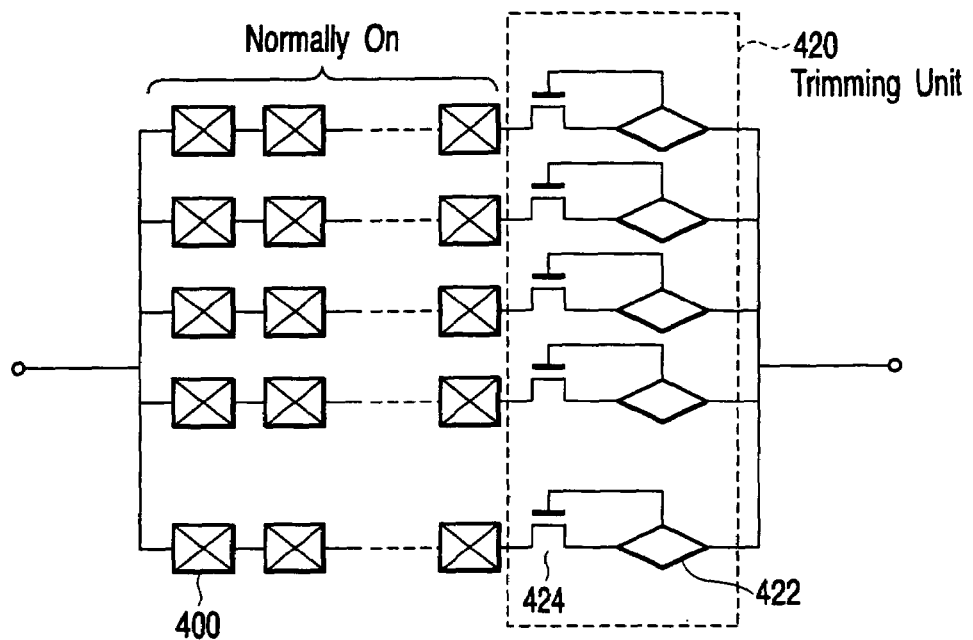
FIG. 36 is a circuit diagram showing a unit configuration in which a plurality of rows are connected in parallel, each row comprising a plurality of normally-on type aging devices and a trimming units connected in series.

In FIG. 36, series-connected normally-on type aging device cells 400 are further connected in series with an MOSFET 424 and an operational circuit 422, and these components are further connected in parallel. The MOSFETs 424 and the operational circuits 422 constitute a trimming unit 420. This trimming unit 420 is the same as that described in Jpn. Pat. Appln. KOKAI Publication No. 2004-172404, the entire contents of which are incorporated herein, by the inventor of the present invention. The unit has a function of measuring a current flowing through the operational circuit 422 to turn off the MOSFET 424 in a case where a measured value does not fall in a certain region. Accordingly, a life error by a shape fluctuation of the aging device cells 400 can be brought into a predetermined range.

Figure 37:
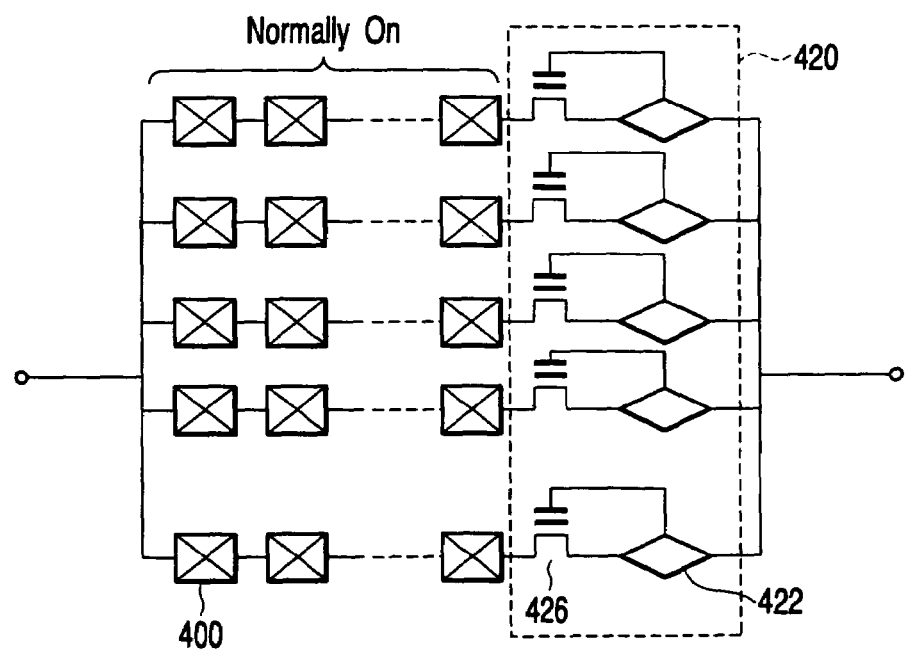
FIGS. 37 to 42 are diagrams showing modifications of FIG. 36.

Needless to say, as shown in FIG. 37, the MOSFET 424 in the trimming unit 420 may be replaced with a nonvolatile memory cell 426. The MOSFET 424 or the nonvolatile memory cell 426 is not limited as long as it has a function of cutting a signal in response to an instruction of the operational circuit 422. For example, it is also possible to directly break a wire by electromigration. That is, constituting elements of the trimming unit 420 include: an operational circuit 422 which detects a signal current to transmit an instruction signal in such a manner that the signal current is cut in a case where the current does not fall within a predetermined range; and a breaker which cuts the signal current in response to the instruction signal of the operational circuit 422. Here, the breaker is a generic name of a device having the signal cutting function, including an MOSFET, nonvolatile memory cell, disconnection by electromigration or the like.

Figure 38:
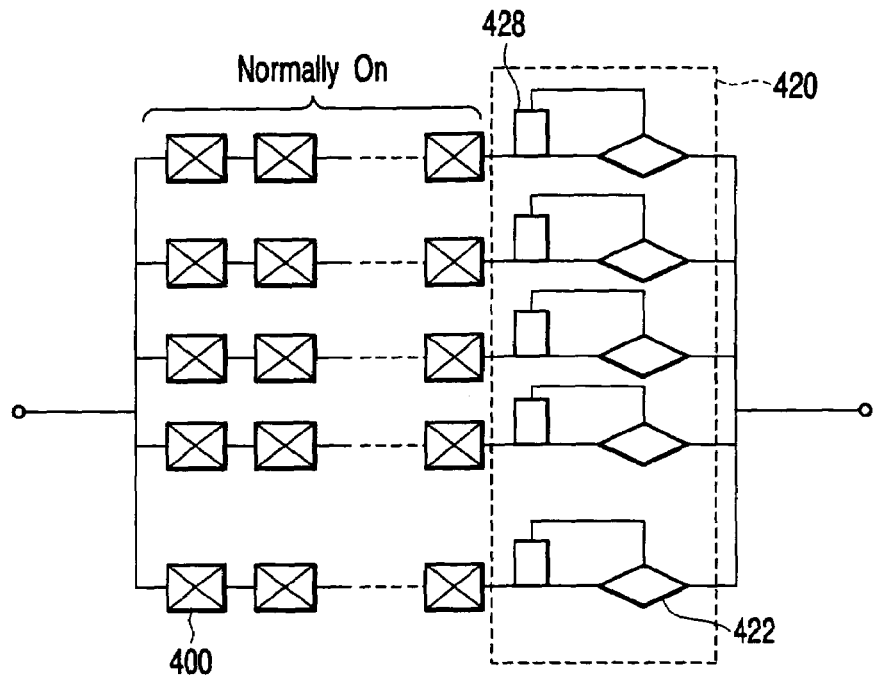
Figure 39:
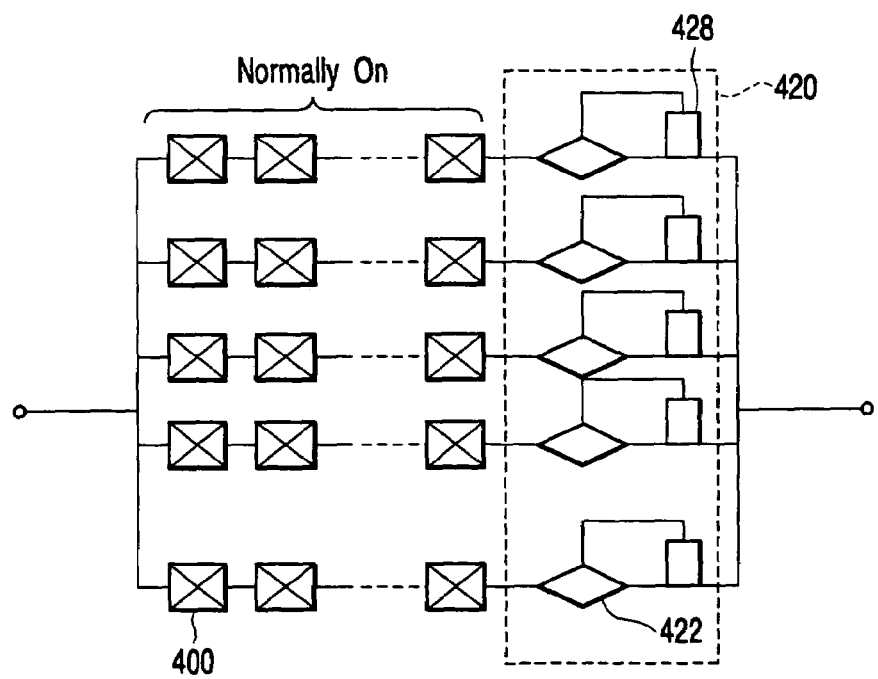
Figure 40:
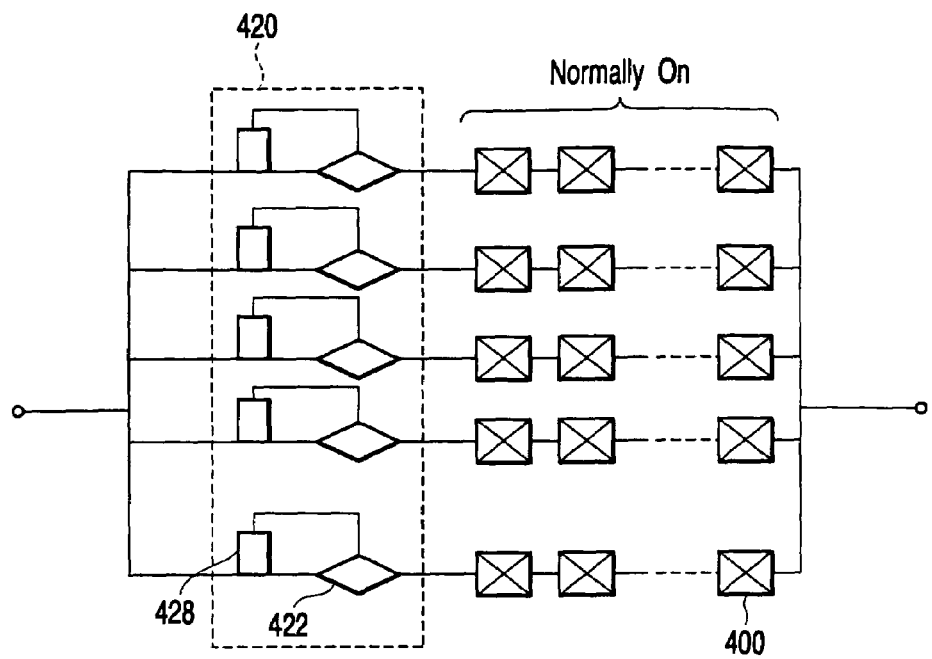
Figure 41:
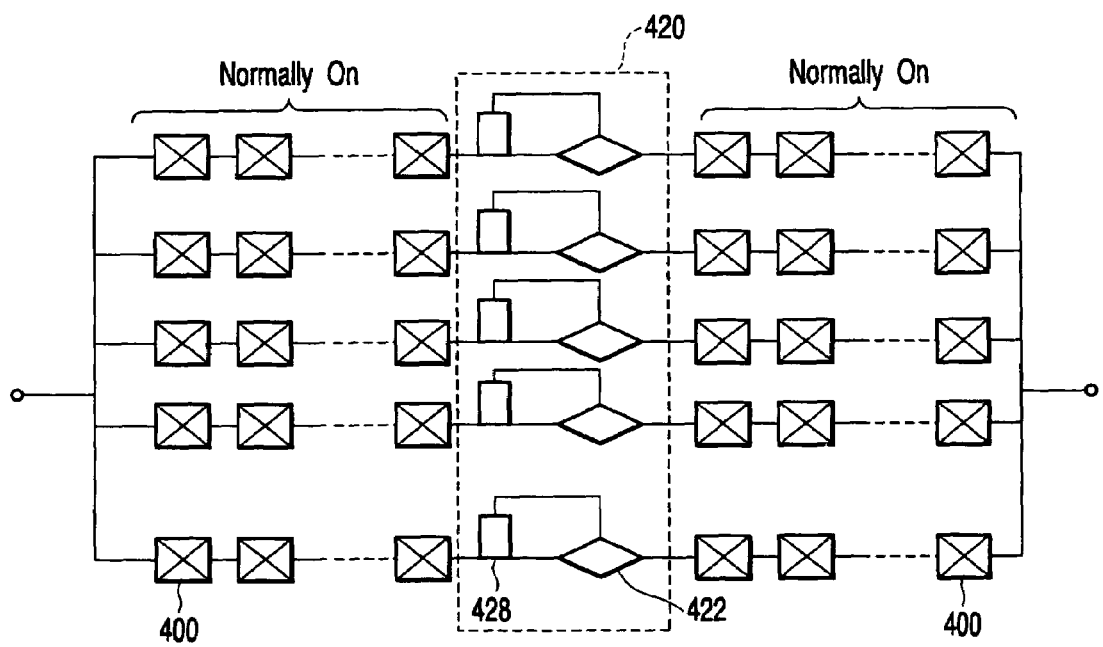
Figure 42:
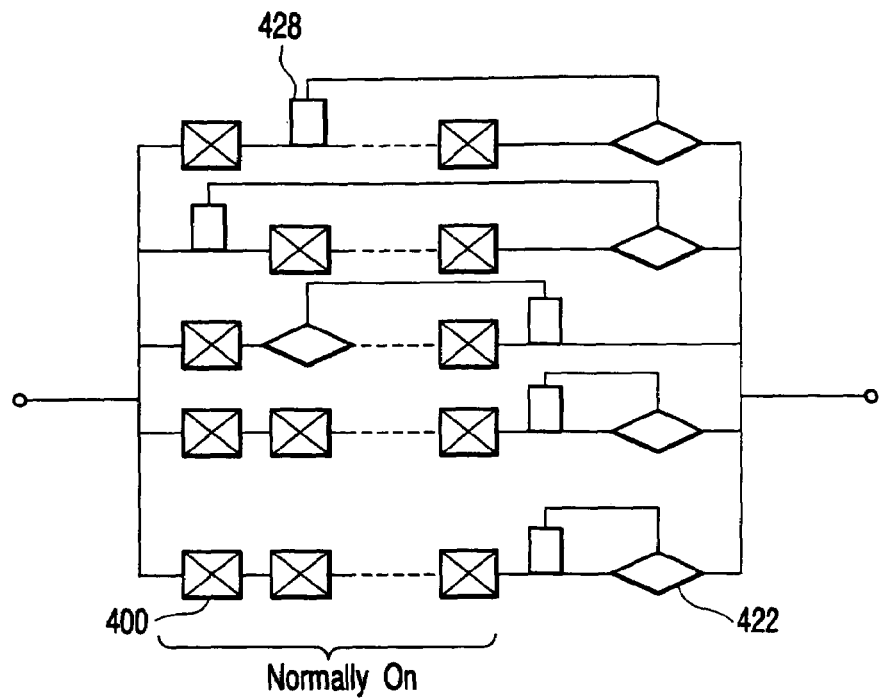

FIG. 38 shows one example of a circuit diagram. In the example, series-connected normally-on type aging device cells 400 are connected in series with a breaker 428 and an operational circuit 422, and they are further connected in parallel with one another. Accordingly, a defective bit countermeasure is taken, and further a life error due to a device shape is handled. FIG. 39 shows that a position of the breaker 428 is replaced with that of the operational circuit 422 in the trimming unit 420. FIG. 40 shows that a positional relation is reversed between the trimming unit 420 and a group of normally-on type aging device cells 400. FIG. 41 shows that the trimming unit 420 is disposed in a middle of the group of the normally-on type aging device cells 400. FIG. 42 shows that the breaker 428, operational circuit 422, and normally-on type aging device cells 400 are connected in series with one another in an arbitrary order, and further connected in parallel. Also in this case, the above-described effect can be produced. When the breaker 428, operational circuit 422, and normally-on type aging device cells 400 are connected in series, and further connected in parallel in this manner, both the defective bit countermeasure and the life fluctuation control can be simultaneously realized regardless of the order in the series connection.

Figure 43:
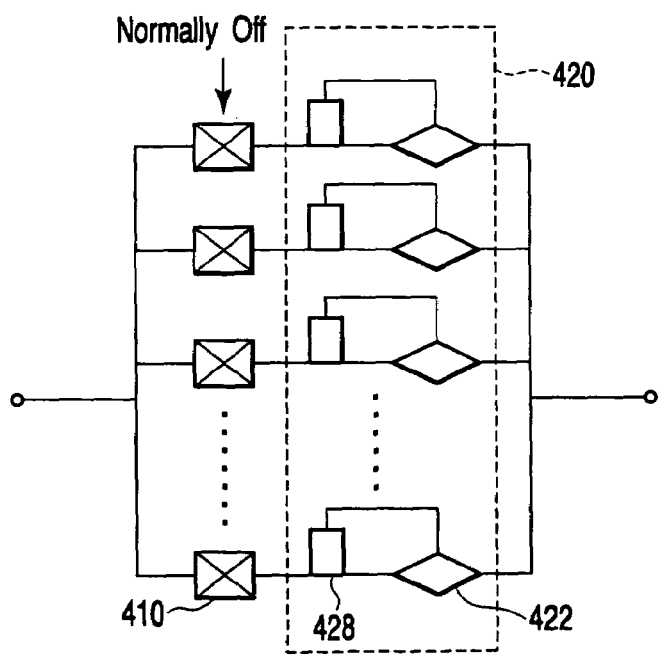
FIG. 43 is a circuit diagram showing a unit configuration in which a plurality of rows are connected in parallel, each row comprising a normally-off type aging device and a trimming unit connected in series.

Subsequently, specific methods will be described with respect to the defective bit countermeasure and the life fluctuation control in a normally-off type. As shown in FIG. 43, the trimming unit 420 is connected in series with one normally-off type aging device cell 410. This series connection is further connected in parallel. By the breaker 428 and the operational circuit 422, shape fluctuations are controlled when cutting the signal by the breaker 428 in a case where the signal current detected in the on-state does not fall in a predetermined range. The aging device cells 410 which are left without being cut constitute a group of cells whose lives fall within a predetermined range. The juxtaposition of the cells can further remove the influence of the defective bit from the group.

Figure 44:
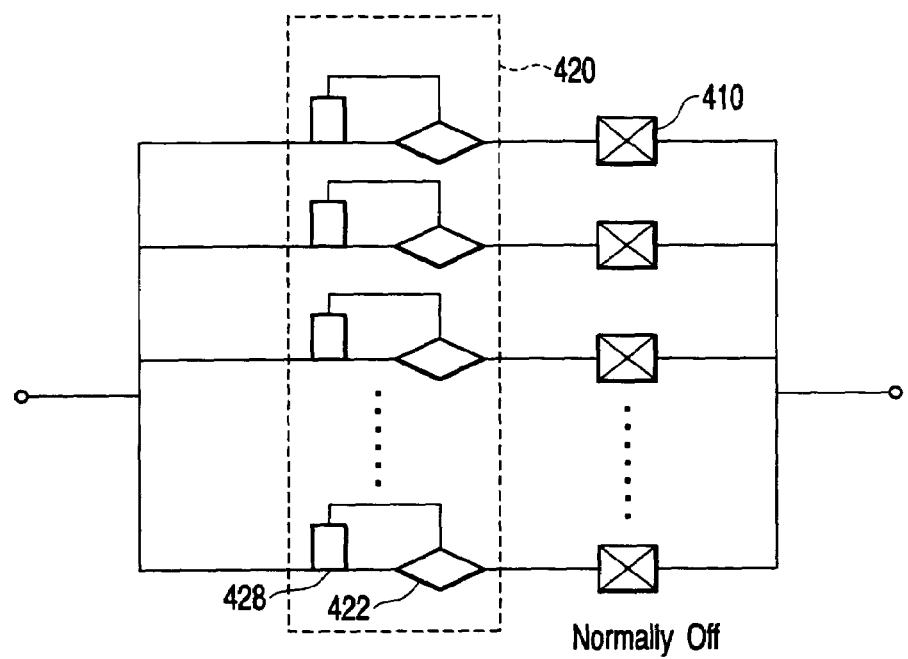
FIGS. 44 and 45 are diagrams showing modifications of FIG. 43.
Figure 45:
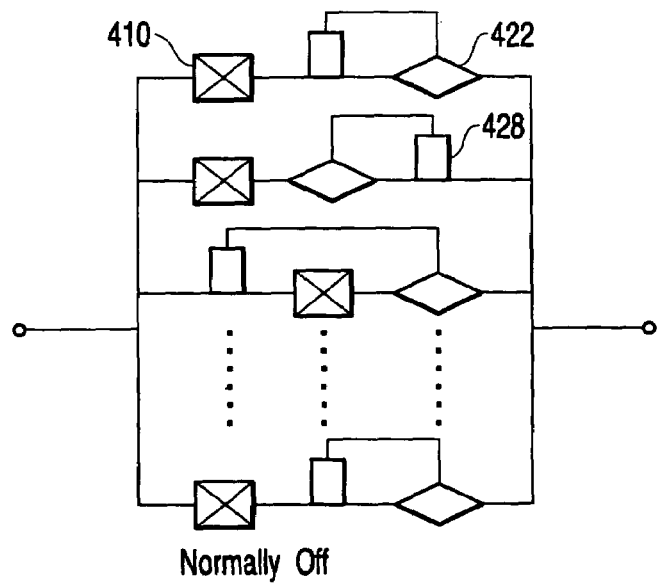

FIG. 44 shows that a positional relation is reversed between the trimming unit 420 and the normally-off type aging device cells 410. In FIG. 44, the breaker 428, operational circuit 422, and normally-off type aging device cell 410 are connected in series, and further juxtaposed. Even in this configuration, the above-described effect can be obtained. When the breaker 428 is only connected in series with the operational circuit 422 and normally-off type aging device cell 410 in this manner, the juxtaposition of the series connection can simultaneously realize the defective bit countermeasure and the life error control by the shape fluctuation within the predetermined range regardless of the order.

Figure 46:
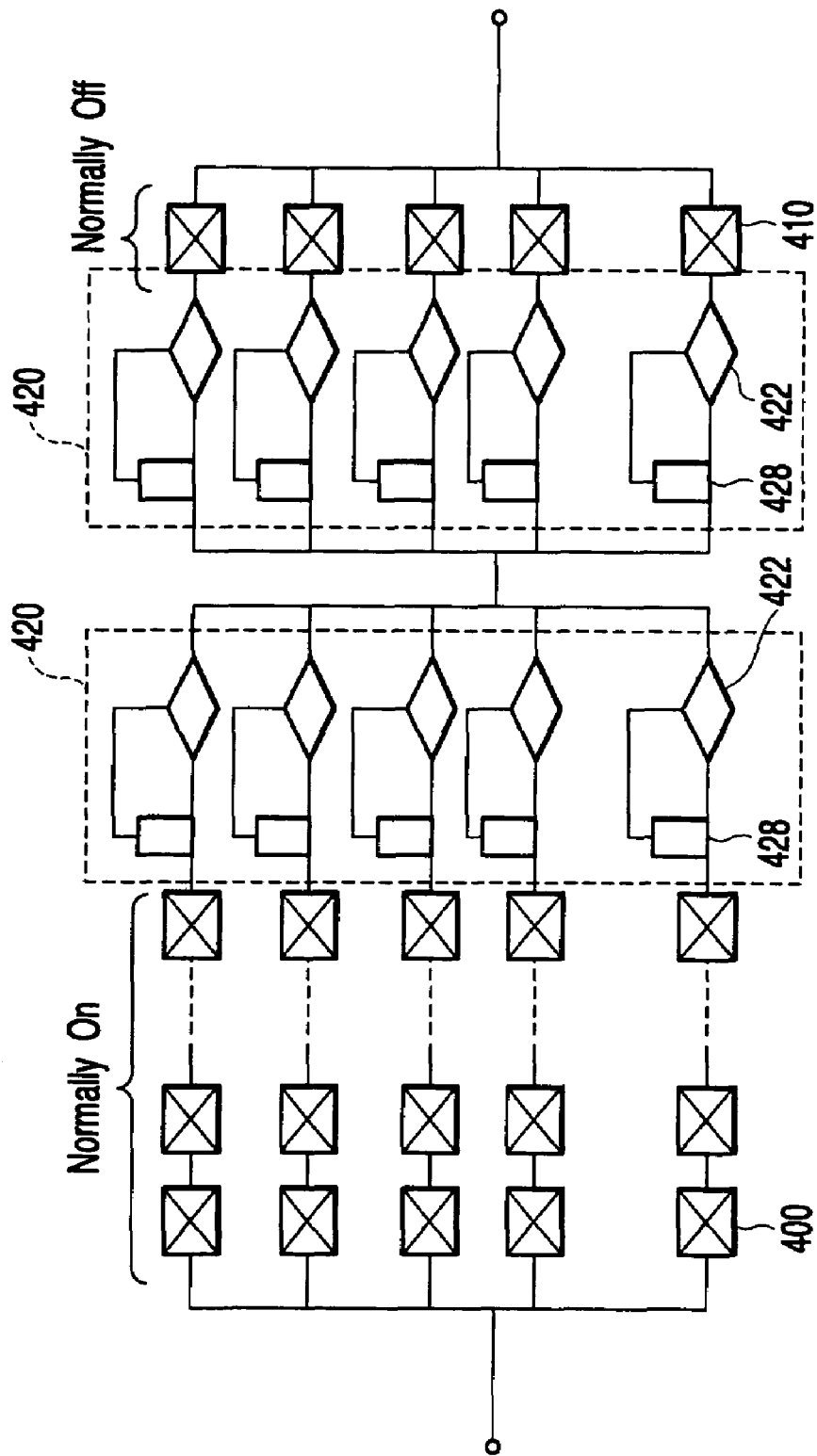
FIG. 46 is a circuit diagram showing a configuration of an aging device having an off-on-off characteristic according to the eighth embodiment by a combination of the aging devices of FIGS. 38 and 44.

As described above, the defective bit countermeasure and the life fluctuation countermeasure can be simultaneously realized by the use of the trimming unit 420 including the breaker 428 and operational circuit 422 with respect to the normally-off type aging device cell 410 and the normally-on type aging device cell 400. These technologies can be further combined to constitute an aging device system which realizes the off-on-off characteristic as shown in one example of FIG. 46. An operation principle is already obvious, and the description is therefore omitted. It is preferable to use the aging device system having the off-on-off characteristic subjected to both the defective bit countermeasure and the life fluctuation control as represented by FIG. 46 in the aging device shown in FIGS. 6, 9, 10, 11, 13-15, 18-20, and 33.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an input terminal;
   a first aging device comprising a first source, a first drain, and a first gate, the first source being connected to the input terminal in such a manner as to turn on at a first life $\tau 1$ and turn off at a second life $\tau 2$ ($>\tau 1$);
   a second aging device comprising a second source, a second drain, and a second gate, the second source being connected to the input terminal, the second gate being connected to the first drain of the first aging device, the second drain being connected to the first gate of the first aging device in such a manner as to turn on at a third life $\tau 3$ and turn off at a fourth life $\tau 4$ ($>\tau 3$);
   a first switch element comprising a first terminal and a second terminal, the first terminal being connected to the first drain of the first aging device in such a manner as to turn off when the second aging device is on;
   a second switch element comprising a third terminal and a fourth terminal, the third terminal being connected to the second drain of the second aging device in such a manner as to turn off when the first aging device is on; and
   an output terminal connected to the second terminal of the first switch element, and the fourth terminal of the second switch element.

2. The semiconductor device according to claim 1, wherein each of the first switch element and the second switch element is a MOS transistor whose gate is connected to the drain thereof.

3. The semiconductor device according to claim 1, wherein the first switch element is a MOS transistor whose gate is connected to the first gate of the first aging device, and the second switch element is a MOS transistor whose gate is connected to the second gate of the second aging device.

4. The semiconductor device according to claim 1, further comprising:
   a first booster or a first regulator inserted between the first drain of the first aging device and the second gate of the second aging device; and
   a second booster or a second regulator inserted between the second drain of the second aging device and the first gate of the first aging device.

5. The semiconductor device according to claim 1, wherein the first aging device comprises a series connection of a third aging device of a normally-on type having the first life $\tau 1$ and a fourth aging device of a normally-off type having the second life $\tau 2$, and the second aging device comprises a series connection of a fifth aging device of the normally-on type having the third life $\tau 3$ and a sixth aging device of a normally-off type having the fourth life $\tau 4$.

6. The semiconductor device according to claim 5, wherein each of the third aging device and the fifth aging device includes a plurality of aging device cells of the normally-on type, which are connected in parallel with one another, and each of the fourth aging device and the sixth aging device includes a plurality of aging device cells of the normally-off type, which are connected in parallel with one another.

7. The semiconductor device according to claim 5, wherein each of the third aging device and the fifth aging device includes a plurality of aging device cells of the normally-on type, which are connected in series with one another, and each of the fourth aging device and the sixth aging device includes a plurality of aging device cells of the normally-off type, which are connected in parallel with one another.

8. The semiconductor device according to claim 5, wherein each of the third aging device and the fifth aging device includes a plurality of aging device cells of the normally-on type, which are connected in series to form a plurality of rows, and the plurality of rows are further connected in parallel with one another, and each of the fourth aging device and the sixth aging device includes a plurality of aging device cells of the normally-off type, which are connected in parallel with one another.

9. The semiconductor device according to claim 1, wherein the first aging device and the second aging device include a double-layer gate configuration, which comprises a floating gate and a control gate, and all lives from the first life to the fourth life are defined by a time elapsed immediately after injection of an electric charge into the floating gate until an on and off change of the first aging device and the second aging device is detected.

10. The semiconductor device according to claim 1, further comprising:

at least one of a first function block and a second function block connected to the output terminal; and a third function block connected to the input terminal, the third function block including a power supply.

11. A semiconductor system comprising:

N semiconductor devices each comprising the semiconductor device according to claim 1;

a first function block and a second function block connected to an output terminal of a first semiconductor device among the N semiconductor devices; and an i+2-th function block connected to an input terminal of an i-th semiconductor device among the N semiconductor devices, i being a natural number from 2 to N, an output terminal of the i-th semiconductor device being connected to an input terminal of the I−1-th semiconductor device.

* * * * *